US012538777B2

(12) United States Patent
Hsiung et al.

(10) Patent No.: US 12,538,777 B2
(45) Date of Patent: Jan. 27, 2026

(54) FIN FIELD EFFECT TRANSISTOR (FinFET) HAVING HOURGLASS-SHAPED VIA STRUCTURE ON SOURCE/DRAIN AND METHOD FOR FORMING THE SAME

(71) Applicant: Taiwan Semiconductor Manufacturing Company, Ltd., Hsinchu (TW)

(72) Inventors: Te-Chih Hsiung, Taipei (TW); Jyun-De Wu, New Taipei (TW); Yi-Chun Chang, Hsinchu (TW); Yi-Chen Wang, Hsinchu County (TW); Yuan-Tien Tu, Chiayi County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/673,578

(22) Filed: May 24, 2024

(65) Prior Publication Data
US 2024/0312833 A1     Sep. 19, 2024

Related U.S. Application Data

(63) Continuation of application No. 17/350,974, filed on Jun. 17, 2021, now Pat. No. 11,996,321.

(51) Int. Cl.
*H01L 21/768*     (2006.01)
*H10D 30/67*      (2025.01)

(52) U.S. Cl.
CPC .. *H01L 21/76802* (2013.01); *H01L 21/76877* (2013.01); *H10D 30/6729* (2025.01); *H10D 30/6735* (2025.01)

(58) Field of Classification Search
CPC .......... H10D 30/6735; H10D 30/6729; H10D 64/117; H10D 30/024; H10D 30/6219; H10D 30/797; H01L 21/76877; H01L 21/76802; H01L 23/5226; H01L 21/76804
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 11,996,321 B2 * | 5/2024 | Hsiung ............... H01L 23/5226 |
| 2018/0166571 A1 * | 6/2018 | Liu ...................... H10D 62/832 |
| 2022/0085179 A1 | 3/2022 | Kim et al. |
| 2022/0199522 A1 | 6/2022 | Lee et al. |

(Continued)

*Primary Examiner* — Changhyun Yi
(74) *Attorney, Agent, or Firm* — Birch, Stewart, Kolasch & Birch, LLP

(57) ABSTRACT

A semiconductor structure includes a contact plug on a source/drain region of a transistor, and a via on the contact plug. The via includes a lower portion and an upper portion over the lower portion, the lower portion of the via tapers upward, and the upper portion of the via tapers downward. The semiconductor structure further includes a metal line on the via.

20 Claims, 24 Drawing Sheets

(56) References Cited

U.S. PATENT DOCUMENTS

2022/0238666 A1\* 7/2022 Kim ................... H10D 84/834
2022/0246738 A1\* 8/2022 Kim ................. H01L 21/76831
2022/0310811 A1\* 9/2022 Min ................. H01L 29/66439

\* cited by examiner

FIN FIELD EFFECT TRANSISTOR (FinFET) HAVING HOURGLASS-SHAPED VIA STRUCTURE ON SOURCE/DRAIN AND METHOD FOR FORMING THE SAME

PRIORITY CLAIM AND CROSS-REFERENCE

This application is a Continuation Application of U.S. application Ser. No. 17/350,974, filed on Jun. 17, 2021, entitled "SEMICONDUCTOR STRUCTURE AND METHOD FOR FORMING THE SAME," which is incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2E-1 is an enlarged view of a via opening shown in FIG. 2E, in accordance with some embodiments of the disclosure.

FIG. 2F-1 is an enlarged view of a via shown in FIG. 2E, in accordance with some embodiments of the disclosure.

FIG. 3B-1 is an enlarged view of a via shown in FIG. 3B, in accordance with some embodiments of the disclosure.

DETAILED DESCRIPTION

Figure 1:
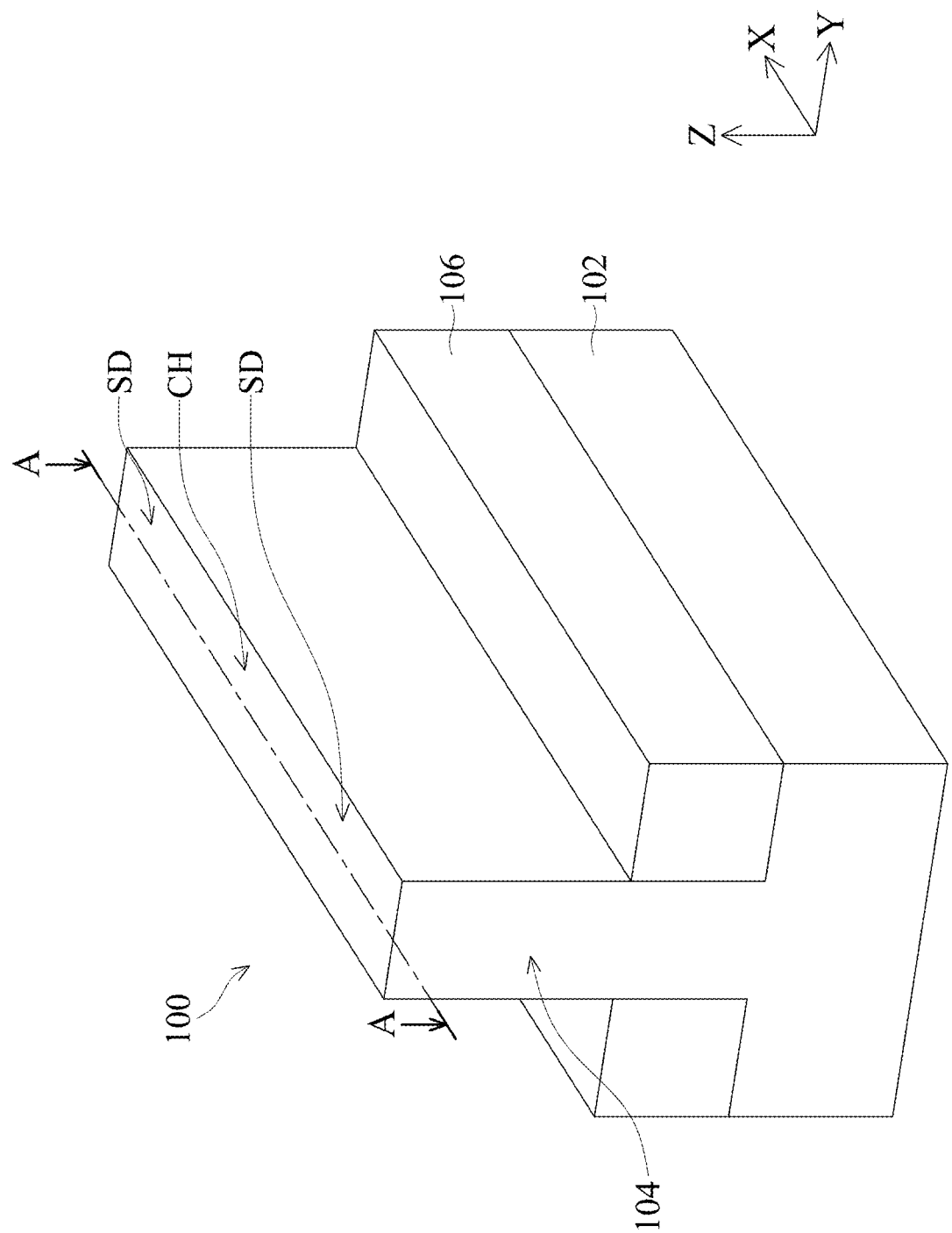
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of a method for forming a semiconductor device are provided. The method may include etching the upper interlayer dielectric layer to form the via opening, etching the etching stop layer to enlarge the via opening, and forming the via in the via opening. Etching the etching stop layer includes using $H_2$ as a carrier gas to improve the etching isotropy. As a result, the etching stop layer is laterally etched a first lateral etching amount at the top surface of the etching stop layer and is laterally etched a second lateral etching amount at the bottom surface of the etching stop layer, and the second lateral etching amount is greater than the first lateral etching amount. By enhancing the lateral etching amount, the via may be formed with a relatively wide bottom portion. Therefore, the resistance of the via may be lowered, which may improve the performance of the resulting semiconductor device.

FIG. 1 is a perspective view of a semiconductor structure 100, in accordance with some embodiments. The semiconductor structure 100 includes a substrate 102, and a fin structure 104 and an isolation structure 106 over the substrate 102, in accordance with some embodiments. Although one fin structure 104 is illustrated in FIG. 1, more than one fin structure 104 may be formed over the semiconductor structure 100.

For a better understanding of the semiconductor structure, X-Y-Z coordinate reference is provided in the figures of the present disclosure. X-axis and Y-axis are generally orientated along the lateral (or horizontal) directions that are parallel to the main surface of the substrate 102. Y-axis is transverse (e.g., substantially perpendicular) to the X-axis. Z-axis is generally oriented along the vertical direction that is perpendicular to the main surface of the substrate 102 (or the X-Y plane).

The fin structure 104 extends in X direction, in accordance with some embodiments. That is, the fin structure 104 has a longitudinal axis parallel to X direction, in accordance with some embodiments. X direction may also be referred to as the channel-extending direction. The current of the resulting semiconductor device (i.e., FinFET) flows in X direction through the channel.

The fin structure 104 includes a channel region CH and source/drain regions SD, where the channel region CH is defined between the source/drain regions SD, in accordance with some embodiments. In this disclosure, a source/drain refers to a source and/or a drain. It should be noted that in the present disclosure, a source and a drain are used interchangeably and the structures thereof are substantially the same. FIG. 1 shows one channel region CH and two source/drain regions SD for illustrative purposes and is not intended to be limiting. The number of channel regions CH and source/drain regions may be dependent on the demands on the design of the semiconductor device and/or performance considerations. A gate structure or gate stack (not shown) will be formed with a longitudinal axis parallel to Y direction and extending across and/or surrounding the channel region CH of the fin structure 104. Y direction may also be referred to as a gate-extending direction.

FIG. 1 further illustrates a reference cross-section that is used in later figures. Cross-section X-X is in a plane parallel to the longitudinal axis (X direction) and through the fin structure 104, in accordance with some embodiments.

FIGS. 2A-2G are cross-sectional views illustrating the formation of a semiconductor structure at various intermediate stages, in accordance with some embodiments. The cross-sectional views correspond to plane A-A shown in FIG. 1, in accordance with some embodiments.

Figure 2A:
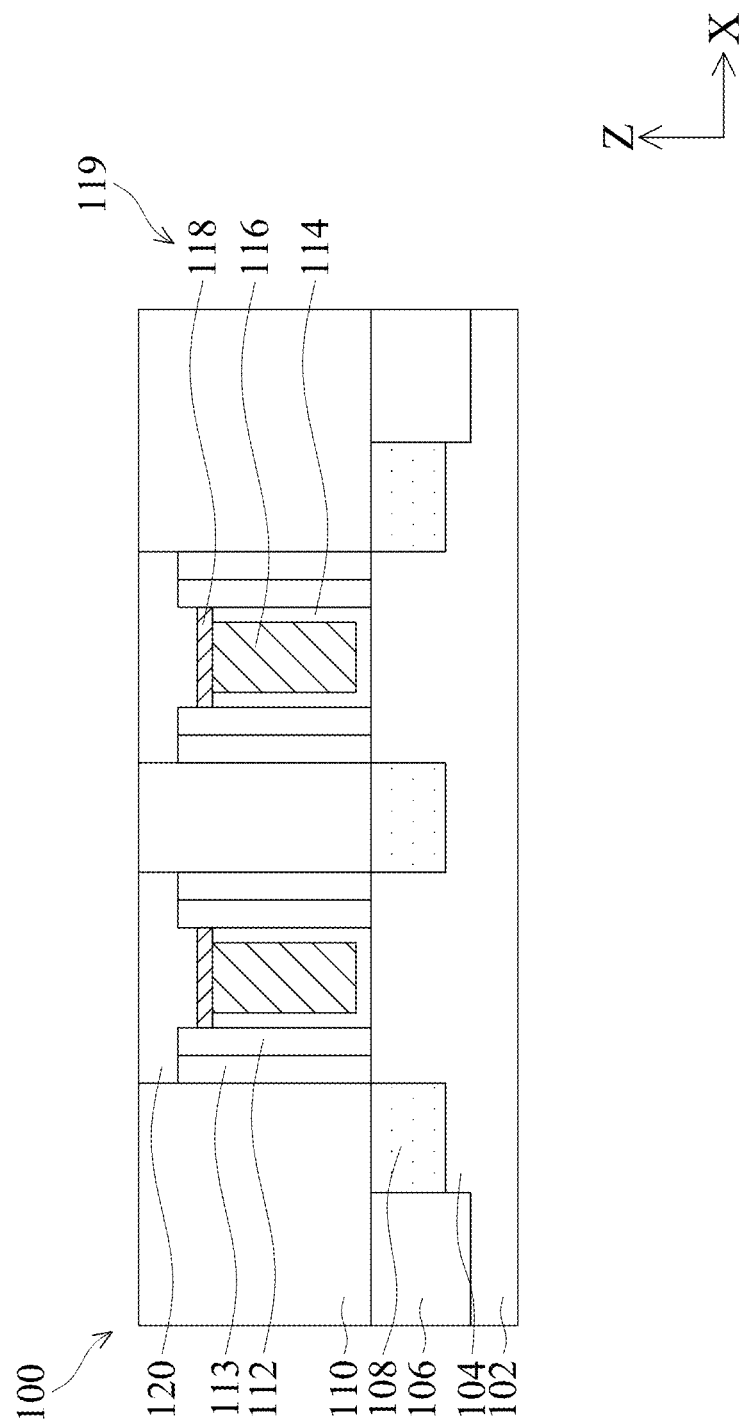
FIGS. 2A, 2B, 2C, 2D, 2E, 2F and 2G are cross-sectional views illustrating the formation of a semiconductor structure at various intermediate stages, in accordance with some embodiments of the disclosure.

FIG. 2A illustrates a semiconductor structure 100 which may be a portion of a FinFET device, in accordance with some embodiments. The formation of the semiconductor structure 100 includes receiving or providing a substrate 102, and forming a fin structure 104 and an isolation structure 106 over the substrate 102, in accordance with some embodiments. The isolation structure 106 surrounds a lower portion the fin structure 104, in accordance with some embodiments. In some embodiments, the isolation structure 106 cuts through the fin structure 104 into several segments. In some embodiments, the fin structure 104 extends in X direction. That is, the fin structure 104 has a longitudinal axis parallel to X direction, in accordance with some embodiments.

In some embodiments, the substrate 102 is a semiconductor substrate such as a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

Though the semiconductor structure 100 is depicted with one fin structure 104, the embodiments of the present disclosure contemplate the semiconductor structure 100 having more than one fin structure 104. In some embodiments, the formation of the fin structure 104 includes etching the substrate 102 to form trenches so that the fin structure 104 protrudes from between the trenches. Afterward, the trenches are filled with insulating material for the isolation structure 106, in accordance with some embodiments. The insulating material is also formed over the upper surfaces of the fin structure 104, in accordance with some embodiments.

In some embodiments, the insulating material includes silicon oxide, silicon nitride, silicon oxynitride (SiON), another suitable insulating material, and/or a combination thereof. In some embodiments, the insulating material is deposited using chemical vapor deposition (CVD) such as low pressure CVD (LPCVD), plasma enhanced CVD (PECVD), or high density plasma CVD (HDP-CVD), high aspect ratio process (HARP), flowable CVD (FCVD)); atomic layer deposition (ALD); another suitable method, and/or a combination thereof.

The insulating material over the upper surface of the fin structure 104 is removed to expose the upper surface of the fin structure 104, for example, using chemical mechanical polishing (CMP), in accordance with some embodiments. Afterward, the insulating material is further recessed to expose an upper portion of the sidewalls of the fin structure 104 and forms the isolation structure 106 that surrounds the lower portion of the fin structure 104, in accordance with some embodiments.

In some embodiments, the semiconductor structure 100 is formed using a gate-late process. For example, dummy gate structures (not shown) including dummy gate dielectric layers and dummy gate electrode layers may be formed across the channel regions of the fin structure 104 in the place where gate stacks 119 are to be formed. The dummy gate structure is configured as a sacrificial structure and will be replaced with the final gate stack, in accordance with some embodiments.

The dummy gate dielectric layer is formed along the upper portion of the fin structure 104, in accordance with some embodiments. In some embodiments, the dummy gate dielectric layer is made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using ALD, CVD, thermal oxidation, physical vapor deposition (PVD), another suitable technique, and/or a combination thereof.

The dummy gate electrode layer is formed over the dummy gate dielectric layer, in accordance with some embodiments. In some embodiments, the dummy gate electrode layer is made of semiconductor material such as polysilicon, poly-silicon germanium. In some embodiments, the material for the dummy gate electrode layer is formed using CVD, another suitable technique, and/or a combination thereof. Afterward, the materials for the dummy gate electrode layer and the dummy gate dielectric layer are patterned into the dummy gate structure, such as using photolithography and etching processes.

The formation of the semiconductor structure 100 further includes forming gate spacer layers 112 and 113 over the substrate 102, as shown in FIG. 2A, in accordance with some embodiments. The gate spacer layers 112 and 113 extend along opposite sides of the dummy gate structures, in accordance with some embodiments. In some embodiments, the gate spacer layers 112 and 113 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the formation of the gate spacer layers 112 and 113 includes sequentially depositing dielectric materials for the gate spacer layer 112 and the gate spacer layer 113 over the substrate 102 followed by an anisotropic etching process such as dry etching.

The formation of the semiconductor structure 100 further includes forming source/drain features 108 in the source region and the drain region of the fin structure 104, as shown in FIG. 2A, in accordance with some embodiments. The source/drain features 108 are formed on the fin structure 104 and on the opposite sides of the dummy gate structures, in accordance with some embodiments.

The formation of the source/drain features 108 includes recessing the source/drain region of the fin structure 104 using the dummy gate structures and the gate spacer layers 112 and 112 as masks to form source/drain recesses on opposite sides of the dummy gate structures, as shown in FIG. 2A, in accordance with some embodiments. Afterward, the source/drain features 108 are grown in the source/drain recesses using an epitaxial growth process, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the source/drain features 108 are made of any suitable material for an n-type semiconductor device and a p-type semiconductor device, such as Ge, Si, GaAs, AlGaAs, SiGe, GaAsP, SiP, SiC, SiCP, or a combination thereof. In some embodiments, the source/drain features 108 are in-situ doped during the epitaxial growth process. For example, the source/drain features 108 may be the epitaxially grown SiGe doped with boron (B). For example, the source/drain features 108 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features.

The formation of the semiconductor structure 100 further includes forming a lower (or first) interlayer dielectric (ILD) layer 110 over the substrate 102, as shown in FIG. 2A, in accordance with some embodiments. The lower interlayer dielectric layer 110 covers the isolation structure 106, the fin structure 104, the dummy gate structures, the gate spacer layers 112 and 113, and the source/drain features 108, in accordance with some embodiments.

In some embodiments, the lower interlayer dielectric layer 110 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), another suitable dielectric material, and/or a combination thereof. In some embodiments, the lower interlayer dielectric layer 110 is formed using CVD (such as HDP-CVD, PECVD, HARP or FCVD), ALD, another suitable method, and/or a combination thereof. Afterward, a planarization process such as CMP and/or an etching back process is performed to remove an excess portion of the dielectric materials from the upper surface of the dummy gate structures.

In some embodiments, the lower interlayer dielectric layer 110 is a multilayer structure. For example, the lower interlayer dielectric layer 110 may include a bottom lining layer that serves as an etching stop layer and a bulk layer having low-k dielectric constant over the bottom lining layer. The term "etching stop layer" used herein refers to a layer that may provide a mechanism to stop or slow down an etching process when forming, e.g., openings, holes, trenches, etc. The bottom lining layer may be made of a dielectric material having a different etching selectivity from the bulk layer.

The formation of the semiconductor structure 100 further includes removing the dummy gate structures. The dummy gate structures are removed using an etching process to form gate trenches, in accordance with some embodiments. The gate trenches expose the channel regions of the fin structure 104, in accordance with some embodiments. In some embodiments, the gate trenches also expose the inner sidewalls of the gate spacer layers 112 facing the channel region, in accordance with some embodiments.

The formation of the semiconductor structure 100 further includes forming gate stacks 119 over the channel region of the fin structure 104 in the gate trenches, as shown in FIG. 2A, in accordance with some embodiments. In some embodiments, the gate stacks 119 extend in Y direction. That is, the gate stacks 119 have longitudinal axes parallel to Y direction, in accordance with some embodiments. In some embodiments, the gate stacks 119 extend across the fin structure 104 so that the gate stacks 119 each wrap a portion of the fin structure 104, in accordance with some embodiments.

The gate stacks 119 interpose between a source region and a drain region of the fin structure 104, where the channel region is defined between the source region and the drain region, in accordance with some embodiments. The gate stacks 119 engage the channel region so that current can flow between the source/drain regions during operation. The source/drain features 108 and the gate stack 119 between the source/drain features 108 combine to form an active device, for example, used for logic devices, memory devices, periphery circuitry devices, other suitable devices, and/or a combination thereof.

In some embodiments, each gate stack 119 includes a gate dielectric layer 114, a gate electrode layer 116 formed on the gate dielectric layer 114, and a metal cap layer 118 formed over the gate electrode layer 116. The gate dielectric layer 114 may include an interfacial layer and a high-k dielectric layer formed over the interfacial layer. The interfacial layer may be made of a chemically formed silicon oxide by one or more cleaning processes such as including ozone ($O_3$), ammonia hydroxide-hydrogen peroxide-water mixture, and/or hydrochloric acid-hydrogen peroxide-water mixture. The interfacial layer may be formed by oxidizing outer portions of the fin structure 104, but not formed on the surface of adjacent dielectric layers (such as gate spacer layers). In some embodiments, the high-k dielectric layer is made of a dielectric material with high dielectric constant (k value), for example, greater than 3.9. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba, Sr) $TiO_3$ (BST), $Al_2O_3$, $Si_3N_4$, oxynitrides (SiON), a combination thereof, or another suitable material. The high-k dielectric layer may be deposited using ALD, physical vapor deposition (PVD), CVD, thermal oxidation, and/or another suitable method.

In some embodiments, the gate electrode layer 116 includes a conductive material, such as doped semiconductor, metal, metal alloy, or metal silicide. In some embodiments, the gate electrode layer 116 includes a single layer or alternatively a multilayer structure, such as various combinations of a metal layer with a selected work function to enhance the device performance (work function metal layer), a liner layer, a wetting layer, an adhesion layer, a metal fill layer, and/or another suitable layer. The gate electrode layer 116 may be made of doped polysilicon, doped poly-germanium, Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof. The gate electrode layer 116 may be formed by ALD, PVD, CVD, e-beam evaporation, or another suitable process. Furthermore, the gate stacks 119 may be formed separately for n-channel FinFETs and p-channel FinFETs, which may use different gate electrode materials and/or different work function materials.

The gate spacer layers 112 and 113 and the gate dielectric layer 114 and the gate stacks 119 are recessed by one or more etching processes, in accordance with some embodiments. In some embodiments, the upper surfaces of the recessed gate spacer layers 112 and 113 are located at a higher level than the upper surfaces of the recessed gate stacks 119. The metal cap layer 118 is formed in the recess and over the gate dielectric layer 114 and the gate electrode layer 116, in accordance with some embodiments.

In some embodiments, the metal cap layer 118 is made of metals such as W, Re, Ir, Co, Ni, Ru, Mo, Al, Ti, Ag, Al, another suitable metal, or multilayers thereof. The metal cap layer 118 may be formed by ALD, PVD, CVD, e-beam evaporation, or another suitable process. In some embodiments, the metal cap layer 118 and the gate electrode layer 116 are made of different materials. In some embodiments, the metal cap layer 118 is made of fluorine-free tungsten, which may lower the total resistance of the gate stack.

The formation of the semiconductor structure 100 further includes forming mask layers 120 over the gate spacer layers 112 and 113 and the gate stacks 119, as shown in FIG. 2A, in accordance with some embodiments. In some embodiments, the mask layers 120 are made of a dielectric material, such as silicon nitride (SiN), silicon carbide (SiC), silicon oxynitride (SiON), silicon oxide ($SiO_2$), silicon carbon nitride (SiCN), silicon oxide carbonitride (SiOCN), and/or a combination thereof. The mask layers 120 may be configured to protect the gate spacer layers 112 and 113 and the gate stacks 119 during the subsequent formation of contact plugs. In some embodiments, the mask layers 120 are made of a different material than the lower interlayer dielectric layer 110 and have a different etching selectivity than the lower interlayer dielectric layer 110.

The formation of the semiconductor structure 100 further includes forming a multilayer interconnect structure over the substrate 102, in accordance with some embodiments. The multilayer interconnect structure electrically couples various devices (for example, transistors, resistors, capacitors, and/or inductors) and/or components of devices (such as the source/drain features 108 and/or the gate stacks 119), in accordance with some embodiments.

In some embodiments, the multilayer interconnect structure typically includes a combination of dielectric layers and electrically conductive features formed in the dielectric layers. The conductive features are configured to form vertical interconnect features (providing, for example, vertical connection between features and/or vertical electrical routing), such as contact plugs and/or vias, and/or horizontal interconnect features (providing, for example, horizontal electrical routing), such as metal lines, in accordance with some embodiments. Vertical conductive features of a multilayer interconnect structure typically connect horizontal conductive features in different layers (or different planes) of the multilayer interconnect structure, in accordance with some embodiments. The formation of a multilayer interconnect structure is described in detail below.

Figure 2B:
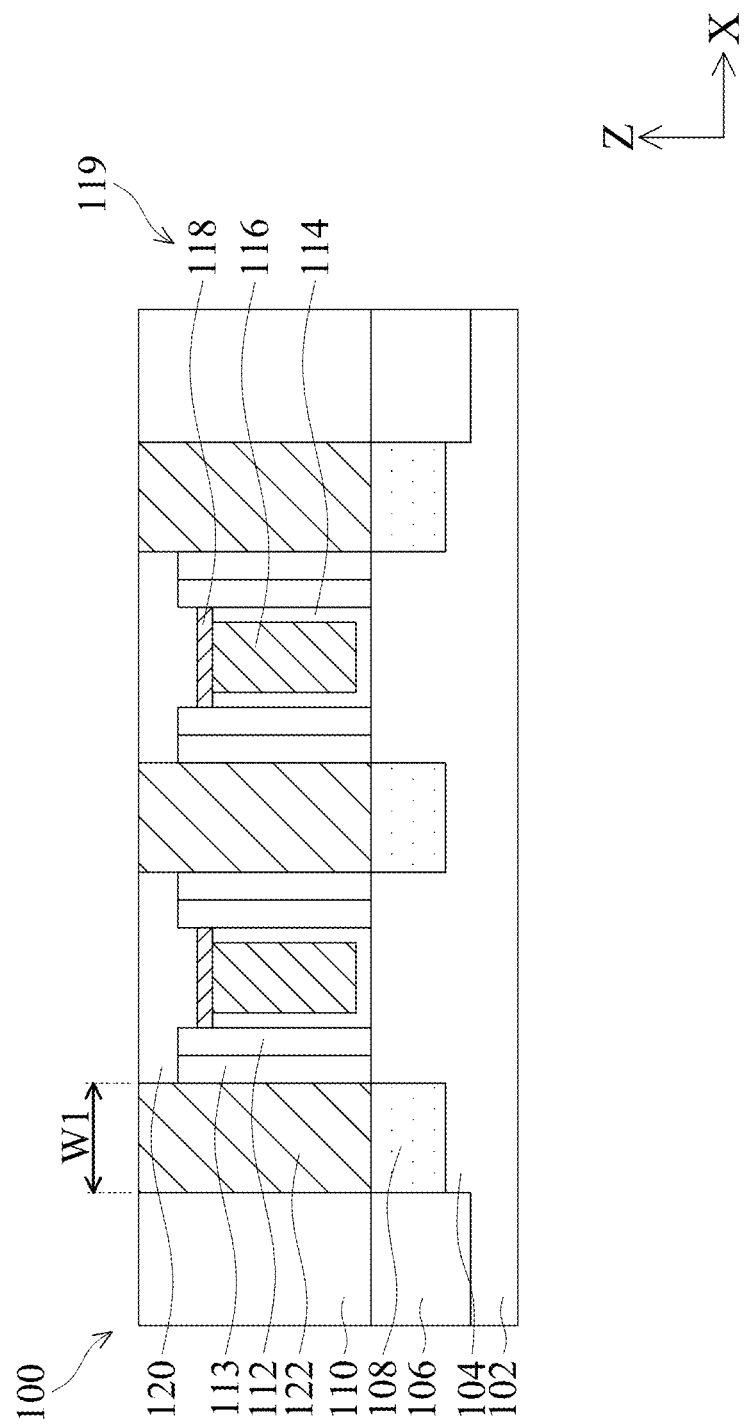

Contact plugs 122 are formed in and/or through the lower interlayer dielectric layer 110, as shown in FIG. 2B, in accordance with some embodiments. In some embodiments, the contact plugs 122 and the lower interlayer dielectric layer 110 combine to form one interconnect layer of the multilayer interconnect structure. The contact plugs 122 land on and are electrically connected to the source/drain features 108, in accordance with some embodiments. In some embodiments, the contact plug 122 has a width W1 at its top surface in a range from about to about 12 nm to about 40 nm.

In some embodiments, the formation of the contact plugs 122 includes patterning the lower interlayer dielectric layer 110 to form contact openings (where the contact plugs 122 are to be formed) through the lower interlayer dielectric layer 110 and exposing the source/drain features 108 using photolithography and etching processes, forming a silicide layer (such as WSi, NiSi, TiSi and/or CoSi) on the exposed source/drain features 108, depositing one or more conductive materials for the contact plugs 122 to fill the contact openings, and planarizing the one or more conductive materials over the upper surface of the lower interlayer dielectric layer 110 using, for example, CMP.

In some embodiments, the conductive material is deposited using CVD, PVD, e-beam evaporation, ALD, electroplating (ECP), electroless deposition (ELD), another suitable method, or a combination thereof. The etch processes may include dry etching such as reactive ion etch (RIE), neutral beam etch (NBE), inductive coupled plasma (ICP) etch, capacitively coupled plasma (CCP) etch, another suitable method, or a combination thereof. After the planarization process, the upper surfaces of the contact plugs 122, the upper surface of the lower interlayer dielectric layer 110 and the upper surfaces of the mask layers 120 are substantially coplanar, in accordance with some embodiments.

The contact plugs 122 may have a multilayer structure including, for example, liner layers, glue layers, barrier layers, seed layers, metal bulk layers, another suitable layer, and/or a combination thereof. For example, a barrier layer (not shown) may optionally be formed along the sidewall and the bottom surface of the contact openings. The barrier layer is used to prevent the metal from the subsequently formed metal material from diffusing into the dielectric material (e.g., the lower interlayer dielectric layer 110). The barrier layer may be made of tantalum (Ta), tantalum nitride (TaN), titanium (Ti), titanium nitride (TiN), cobalt tungsten (CoW), another suitable material, and/or a combination thereof. If the subsequently formed metal material does not easily diffuse into the dielectric material, the barrier layer may be omitted.

A glue layer (not shown) may optionally be formed along the sidewall and the bottom surface of the contact openings, and on the barrier layer (if formed). The glue layer is used to improve adhesion between the subsequently formed metal material and the dielectric material (e.g., the lower interlayer dielectric layer 110). The glue layer may be made of tantalum nitride (TaN), titanium (Ti), titanium nitride (TiN), another suitable material, and/or a combination thereof.

A metal bulk layer is then formed on the glue layer (if formed) to fill the remainder of the contact openings. In some embodiments, the metal bulk layer is formed using a selective deposition technique such as cyclic CVD process or ELD process, and it is not necessary to form a glue layer in the contact openings before depositing the metal bulk material. In some embodiments, the metal bulk layers are made of one or more conductive materials with low resistance and good gap-fill ability, for example, cobalt (Co), nickel (Ni), tungsten (W), titanium (Ti), tantalum (Ta), copper (Cu), aluminum (Al), ruthenium (Ru), molybdenum (Mo), another suitable metal material, and/or a combination thereof.

Figure 2C:
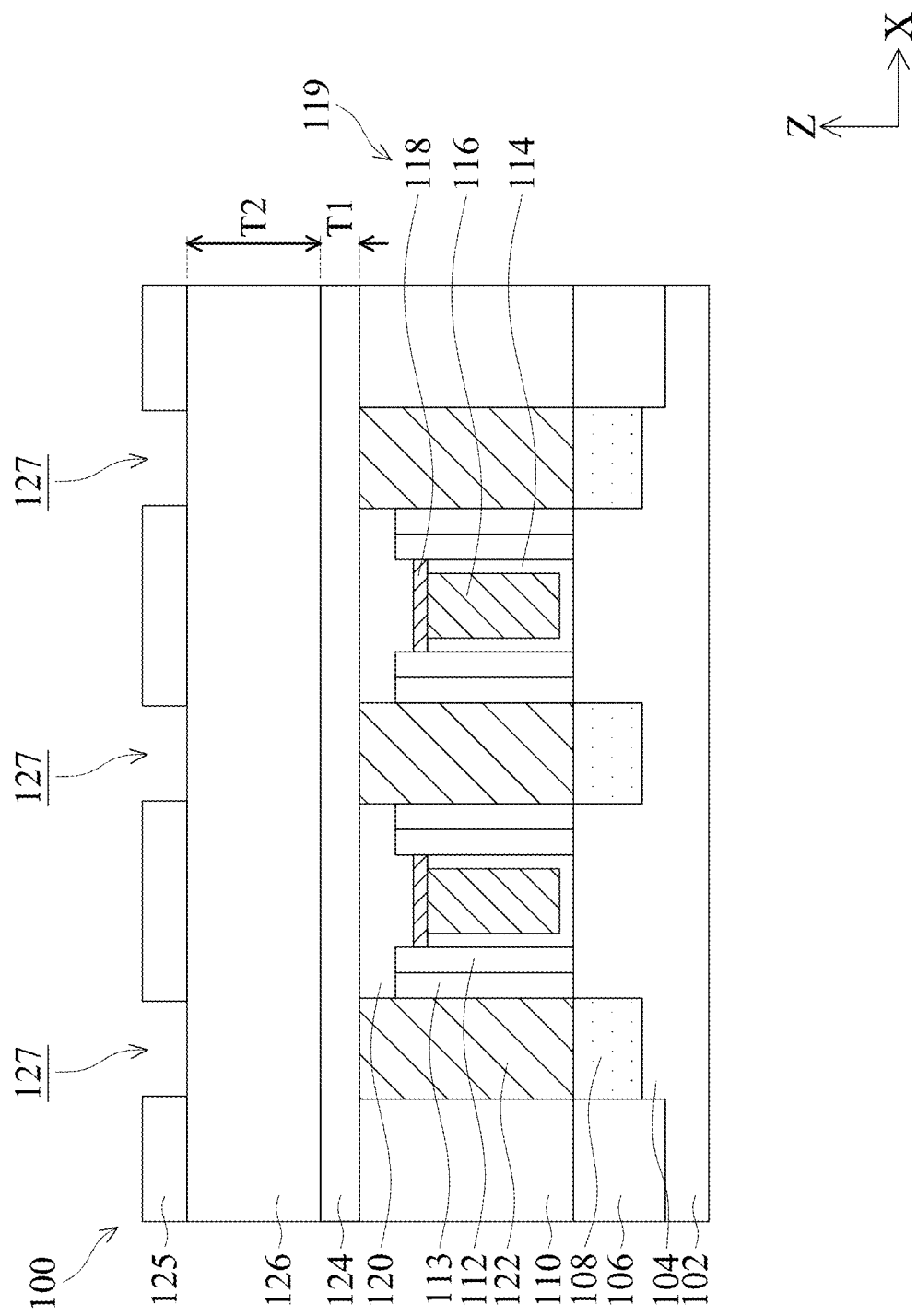

An etching stop layer 124 is formed over the contact plugs 122 and the lower interlayer dielectric layer 110, as shown in FIG. 2C, in accordance with some embodiments. In some embodiments, the etching stop layer 124 has a thickness T1 in a range from about 1 nm to about 15 nm.

In some embodiments, the etching stop layer 124 is made of a silicon-containing dielectric material such as silicon nitride (SiN), silicon carbon nitride (SiCN), silicon oxide carbonitride (SiOCN), silicon carbide (SiC), another suitable dielectric material, and/or a combination thereof. In some embodiments, the etching stop layer 124 is made of a dielectric material with a high-k dielectric constant (such as greater than about 7), for example, aluminum oxide, zirconium oxide, hafnium oxide, yttrium oxide, hafnium oxide, another suitable metal oxide, and/or a combination thereof.

The etching stop layer 124 is globally deposited using CVD, ALD, spin-on coating, another suitable method, or a combination thereof.

An upper (second) interlayer dielectric layer 126 is formed over the etching stop layer 124, as shown in FIG. 2C, in accordance with some embodiments. In some embodiments, the upper interlayer dielectric layer 126 has a thickness T2 in a range from about 10 nm to about 100 nm.

In some embodiments, the upper interlayer dielectric layer 126 is made of a dielectric material, such as USG, or doped silicon oxide such as BPSG, FSG, PSG, BSG, another suitable dielectric material, and/or a combination thereof. In some embodiments, the upper interlayer dielectric layer 126 is formed using CVD (such as HDP-CVD, PECVD, HARP, or FCVD), ALD, another suitable method, and/or a combination thereof. In some embodiments, the etching stop layer 124 is made of a dielectric material having a different etching selectivity from the upper interlayer dielectric layer 126. For example, the etching stop layer 124 is a nitride layer (such as SiN) and the upper interlayer dielectric layer 126 is made of an oxide layer or oxide-based layer (such as $SiO_2$). In some embodiments, the dielectric constant of the etching stop layer 124 is higher than the dielectric constant of the upper interlayer dielectric layer 126.

A patterned mask layer 125 is formed over the upper interlayer dielectric layer 126, as shown in FIG. 2C, in accordance with some embodiments. The patterned mask layer 125 is a patterned photoresist layer and/or a patterned hard mask layer, in accordance with some embodiments. For example, a photoresist may be formed on the upper interlayer dielectric layer 126, such as by using spin-on coating, and patterned with opening patterns 127 corresponding to the underlying contact plugs 122 by exposing the photoresist to light using an appropriate photomask. Exposed or unexposed portions of the photoresist may be removed depending on whether a positive or negative resist is used.

Alternatively, a hard mask layer may be formed on the upper interlayer dielectric layer 126. The hard mask layer may include, or be formed of, a nitrogen-free anti-reflection layer (NFARL), carbon-doped silicon dioxide (e.g., $SiO_2$:C), titanium nitride (TiN), titanium oxide (TiO), boron nitride (BN), a multilayer thereof, another suitable material, and/or a combination thereof. The hard mask layer may be patterned using photolithography and etching processes described above to have opening patterns 127 corresponding to the underlying contact plugs 122.

Figure 2D:
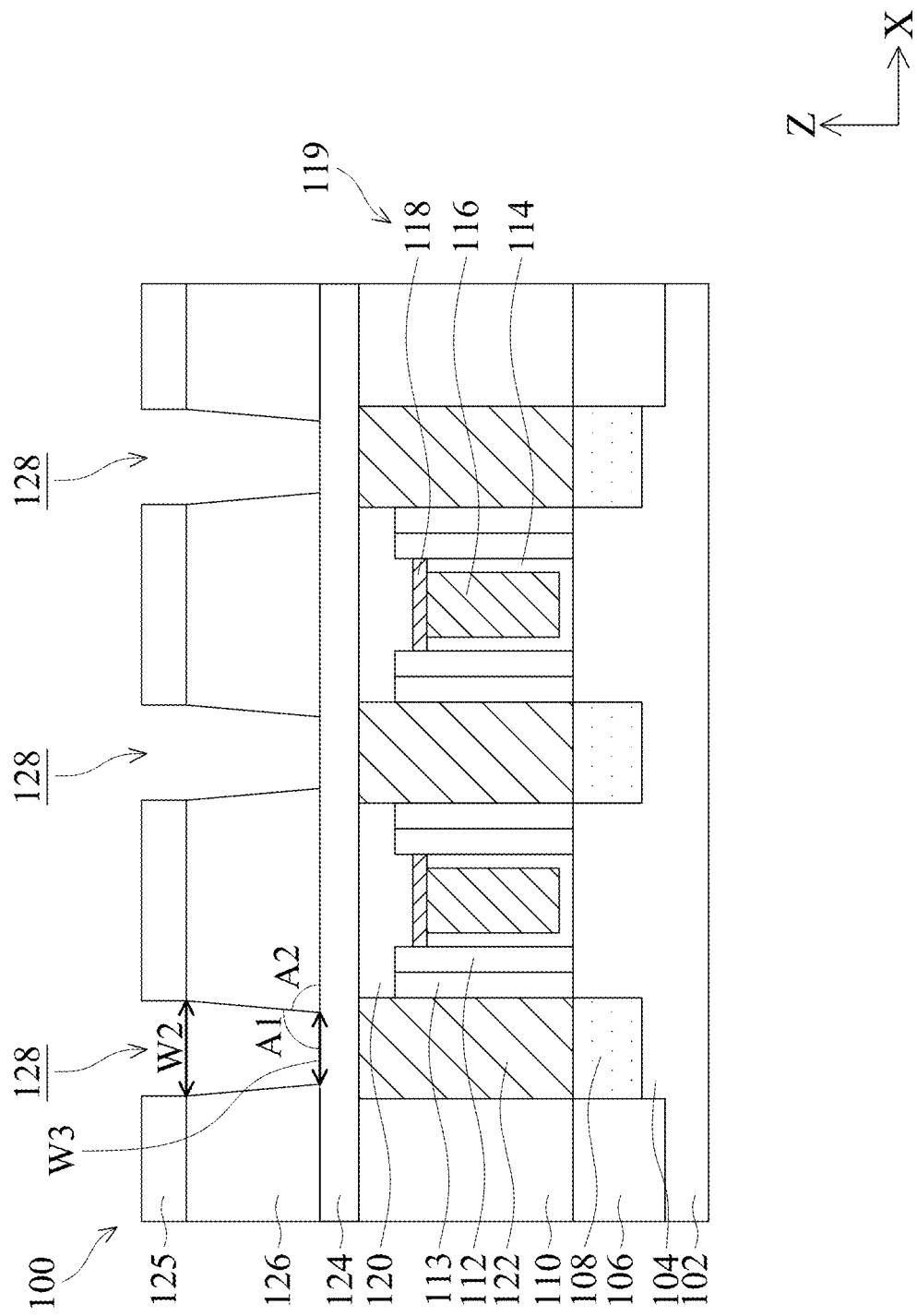
Figure 2E:
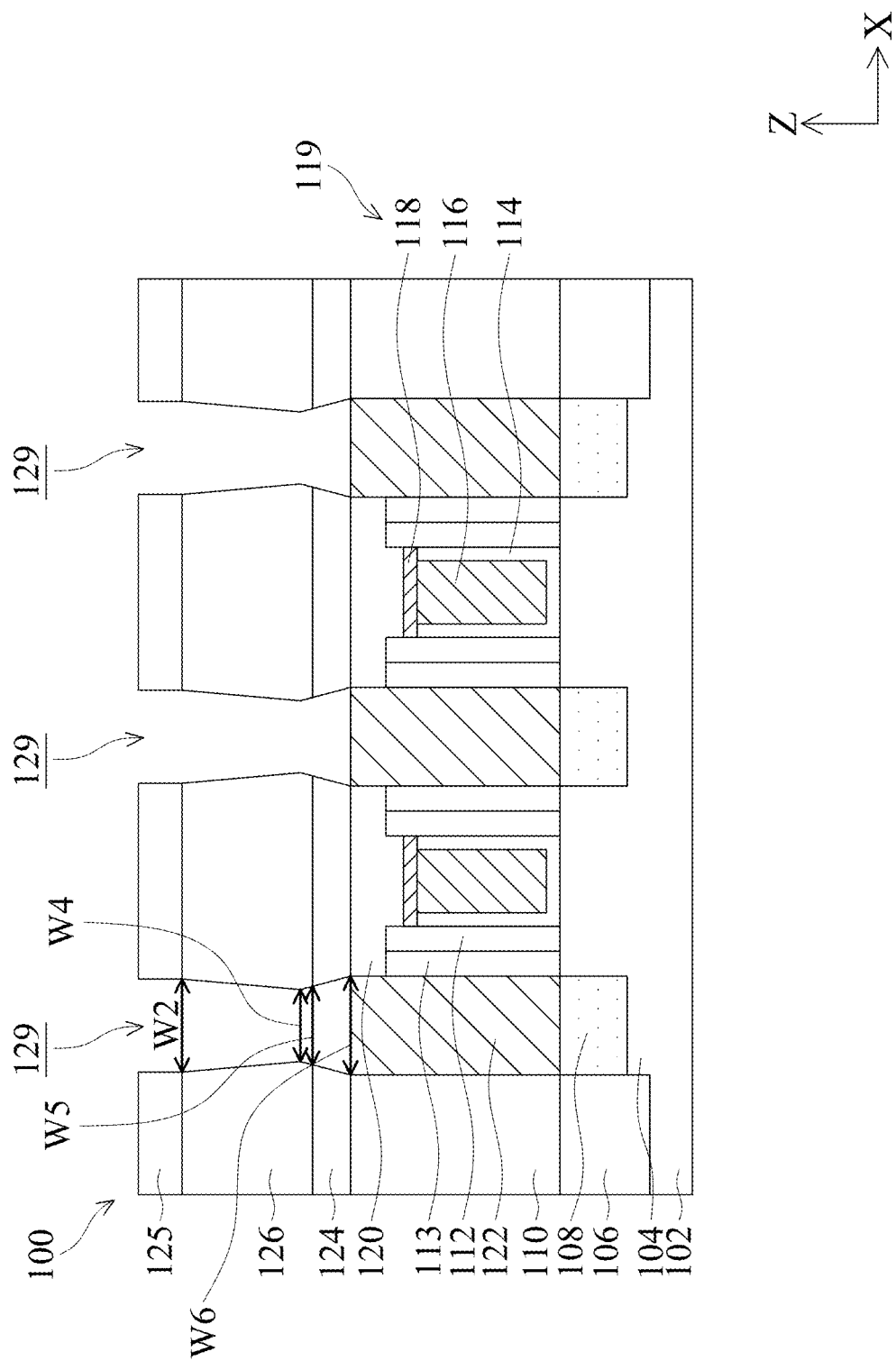
Figures 1, 2E:
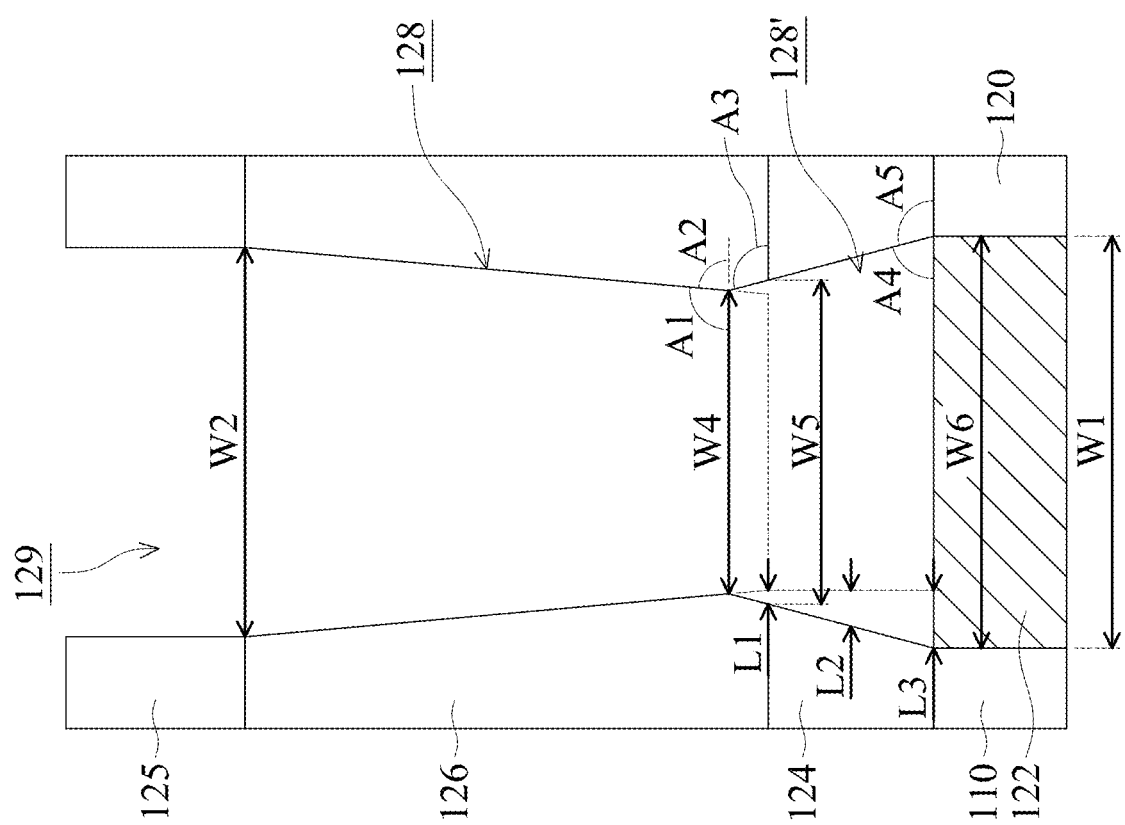

FIGS. 2D and 2E illustrate the formation of via openings 129. An etching process is performed on the upper interlayer dielectric layer 126 and the etching stop layer 124 using the patterned mask layer 125 to form via openings 129, as shown in FIG. 2E, in accordance with some embodiments. The etch processes may include dry etching such as reactive ion etch (RIE), neutral beam etch (NBE), inductive coupled plasma (ICP) etch, capacitively coupled plasma (CCP) etch, another suitable method, or a combination thereof. In some embodiments, the via openings 129 is formed using an etch process which includes multiple etching steps sequentially performed in a single chamber of a single etch tool. In alternative embodiments, the multiple etching steps are performed in separate chambers of a single etch tool. In alternative embodiments, the multiple etching steps are performed in separate etch tools.

FIG. 2D illustrates a first etching step of the etch process. In some embodiments, the first etching step is referred to as a main etching step. During the first etching step, portions of the upper interlayer dielectric layer 126 exposed from the patterned mask layer 125 are etched away until the etching stop layer 124 is exposed, in accordance with some embodiments. The time period of the first etching step may be determined by time mode or endpoint mode. The opening patterns 127 may be transferred into the upper interlayer dielectric layer 126 to form via openings 128.

During the first etching step of the etch processes, the etching chamber provides a RF power (such as source or bias RF power) in a range from 10 watts (W) to about 1000 W, in accordance with some embodiments. The first etching step uses $C_4F_6$ with a flow rate in a range from about 1 standard cubic centimeter per minute (sccm) to about 100 sccm and $O_2$ with a flow rate in a range from about 1 sccm to about 100 sccm as etching precursors (etchants), and Ar with a flow rate in a range from about 1 sccm to about 2000 sccm as a carrier gas, and is performed at a pressure of about 1 mTorr to about 100 mTorr for a duration of about 1 second to about 500 seconds. The flow rate of the carrier gas (Ar) may be much more than the total amount of the flow rate of the etching precursors ($C_4F_6$ and $O_2$). In some embodiments, the first etching step is performed at about −20° C. to about 150° C.

The etching byproduct, residues, and/or polymer (not shown) are formed and accumulated on the sidewalls of the via openings 128 as the first etching step of the etch processes proceeds. As the depth of the via openings 128 becomes deeper, the etching byproduct, residues, and/or polymer may hinder the lateral etching of the first etching step. As a result, the via opening 128 has a downwardly tapered profile, in accordance with some embodiments. In some embodiments, the via opening 128 has a width W2 at the top surface of the via opening 128 in a range from about 12 nm to about 40 nm. In some embodiments, the via opening 128 has a width W3 at the bottom surface of the via opening 128 (i.e., the interface between the upper interlayer dielectric layer 126 and the etching stop layer 124) in a range from about 10 nm to about 38 nm. In some embodiments, the width W3 is less than the width W2.

In some embodiments, the sidewalls of the via opening 128 are linear. In some embodiments, the sidewall and the bottom surface of the via opening 128 intersect at an obtuse angle A1 in a range from about 90 degrees to about 100 degrees, e.g., about 91 degrees to about 93 degrees. In some embodiments, the sidewall (exposed from the via opening 128) and the bottom surface of the upper interlayer dielectric layer 126 intersect at an acute angle A2 in a range from about 80 degrees to about 90 degrees, e.g., about 87 degrees to about 89 degrees.

FIG. 2E illustrates a second etching step of the etch process. In some embodiments, the second etching step is referred to as an over-etching etching step. In some embodiments where the first etching step and the second etching step are sequentially performed in the same etching chamber, transition and/or ramping steps may be performed between the first etching step the second etching step to stabilize temperature, pressure, gas flow, RF power, another suitable parameter of the etching tool, and/or a combination thereof. During the second etching step, portions of the etching stop layer 124 exposed from the via openings 128 are etched away to enlarge the via openings 128 until the contact plugs 122 are exposed, in accordance with some embodiments. The time period of the second etching step may be determined by time mode or endpoint mode. As a result, the opening patterns 127 may be transferred into the upper interlayer dielectric layer 126 and the etching stop layer 124 to form via openings 129.

During the second etching step of the etch processes, the etching chamber provides a RF power (such as source or bias RF power) in a range from 10 W to about 1000 W, in accordance with some embodiments. The second etching step uses $CH_3F$ and/or $CF_4$ with a flow rate in a range from about 1 sccm to about 100 sccm as etching precursors (etchants), and $H_2$ with a flow rate in a range from about 1 sccm to about 2000 sccm as a carrier gas, and is performed at a pressure of about 1 mTorr to about 400 mTorr for a duration of about 1 second to about 500 seconds. The flow rate of the carrier gas ($H_2$) may be much more than the total amount of the flow rate of the etching precursors ($CH_3F$ and/or $CF_4$). The second etching step is performed at about −20° C. to about 150° C.

The etchant and the carrier used in the second etching step are helpful in reducing the formation of the byproduct, residue and/or the polymer and efficiently removing the byproduct, residue and/or the polymer from the sidewall of the via opening, and/or improving the etching isotropy. As a result, during the second step of the etching process, the via opening 128 simultaneously vertically and laterally extends into the etching stop layer 124, in accordance with some embodiments.

In some embodiments where the etching stop layer is made of nitride (such as SiN), $H_2$ may facilitate the lateral etching, especially at the bottom of the via opening. In some embodiments, lateral etching may be increased by increasing the duration and/or increasing the pressure of the second etching step. In some embodiments, the process pressure of the second etching step is greater than the process pressure of the first etching step.

FIG. 2E-1 is an enlarged view of a via opening 129 shown in FIG. 2E, in accordance with some embodiments of the disclosure. The via opening 128 extends into the etching stop layer 124 to form an extension portion 128', in accordance with some embodiments. The via opening 129 includes original via opening 128 through the upper interlayer dielectric layer 128 and the extension portion 128' through the etching stop layer 124, in accordance with some embodiments.

In some embodiments, the lateral etching amount to the etching stop layer 124 (or the amount of the lateral expansion of the via opening 128) increases as the depth increase. For example, the etching stop layer 124 is laterally etched a first lateral etching amount L1 at the top surface of the etching stop layer 124, laterally etched a second lateral etching amount L2 at the middle height of the etching stop layer 124, and laterally etched a third lateral etching amount L3 at the bottom surface of the etching stop layer 124. The first lateral etching amount L1 is less than the second lateral etching amount L2, and the second lateral etching amount L2 is less than the third lateral etching amount L3, in accordance with some embodiments.

In some embodiments, the etching stop layer 124 has a different etching selectivity from the upper interlayer dielectric layer 126, and thus the upper interlayer dielectric layer 126 may remain substantially unetched or is slightly etched during the second etching step. In some embodiments, the bottom portion of the upper interlayer dielectric layer 126 is also laterally etched. As a result, the sidewall of the bottom portion of the upper interlayer dielectric layer 126 and the bottom surface of the upper interlayer dielectric layer 126 intersect at an obtuse angle A3 in a range from about 90 degrees to about 120 degrees, e.g., about 91 degrees to about 110 degrees.

The extension portion 128' of the via opening 129 has an upwardly tapered profile, in accordance with some embodiments. In some embodiments, the extension portion 128' (or the via opening 129) has a width W5 at the top surface of the etching stop layer 124 (i.e., the interface between the upper interlayer dielectric layer 126 and the etching stop layer 124) in a range from about 11 nm to about 50 nm. In some embodiments, the extension portion 128' (or the via opening 129) has a width W6 at the bottom surface of the etching stop layer 124 (i.e., the interface between the etching stop layer 124 and the lower interlayer dielectric layer 110 (or the mask layer 120)) in a range from about 11 nm to about 50 nm. In some embodiments, the width W6 is greater than the width W5. In some embodiments, a ratio of the width W6 to width W5 is greater than 1 and less than about 1.2. In the illustrated embodiments, the width W6 is substantially equal to the width W1 of the contact plug 122. In alternative embodiments, the width W6 may be greater than or less than the width W1. In some embodiments, a ratio of the width W6 to width W1 is in a range from about 0.85 to about 1.2.

In some embodiments, the minimum width W4 of the via opening 129 is at a position between the top surface and the bottom surface of the upper interlayer dielectric layer 126, and the position is closer to the bottom surface than to the top surface. In some embodiments, the minimum width W4 is in a range from about 10 nm to about 38 nm. The via opening 129 has an hourglass-shaped profile, in accordance with some embodiments.

In some embodiments, the sidewalls of the extension portion 128' are linear. In some embodiments, the sidewall and the bottom surface of the extension portion 128' (or the via opening 129) intersect at an acute angle A4 in a range from about 60 degrees to about 90 degrees, e.g., about 70 degrees to about 89 degrees. In some embodiments, the sidewall (exposed from the extension portion 128') and the bottom surface of the etching stop layer 124 intersect at an obtuse angle A5 in a range from about 90 degrees to about 120 degrees, e.g., about 91 degrees to about 110 degrees.

After the etching process for forming the via opening 129, the patterned mask layer 125 is removed such as using an ashing process, a wet strip process, another suitable technique, and/or a combination thereof. In alternative embodiments, the patterned mask layer 125 is removed during the etching process for forming the via opening 129.

Figure 2F:
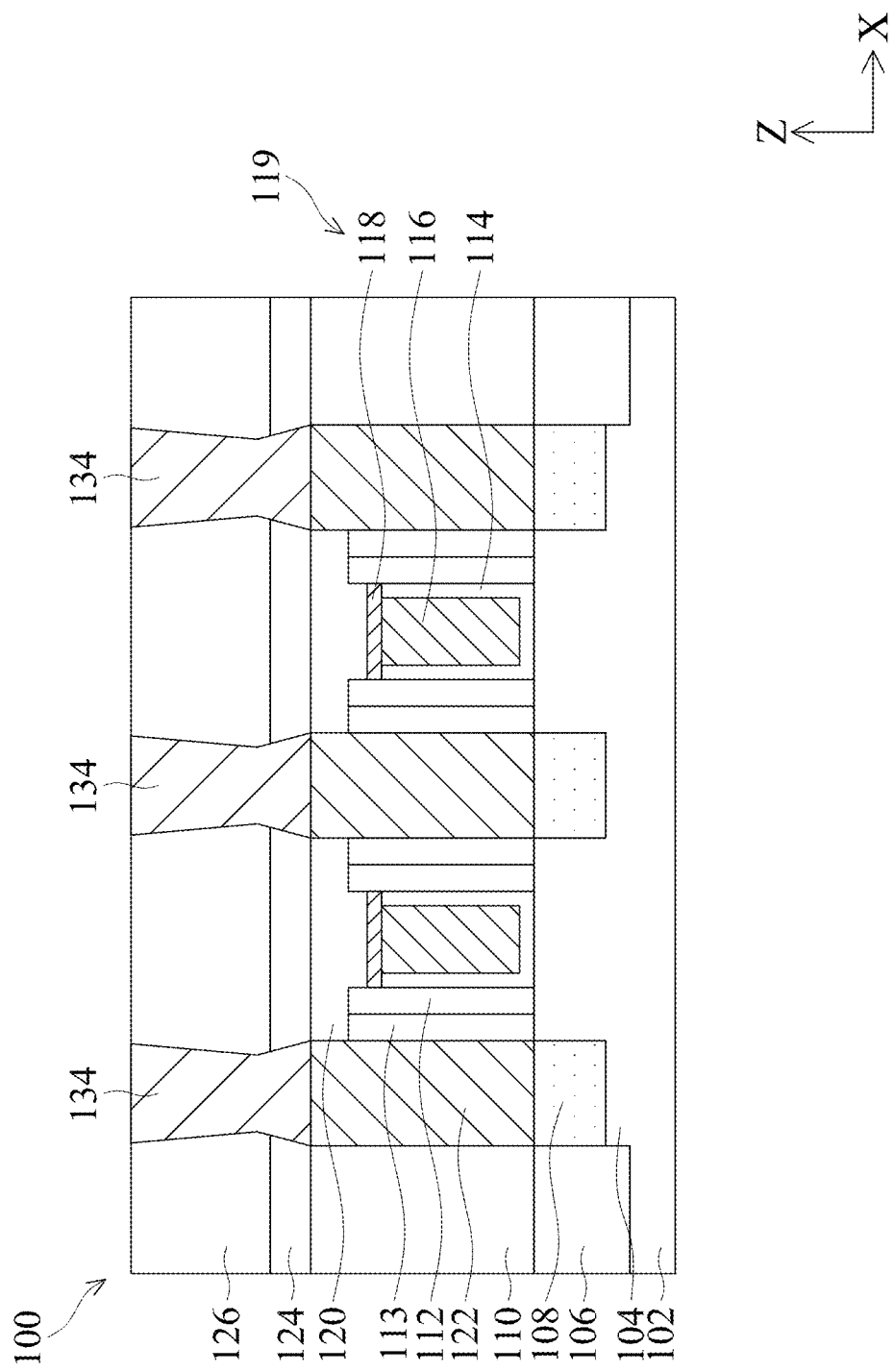
Figures 1, 2F:
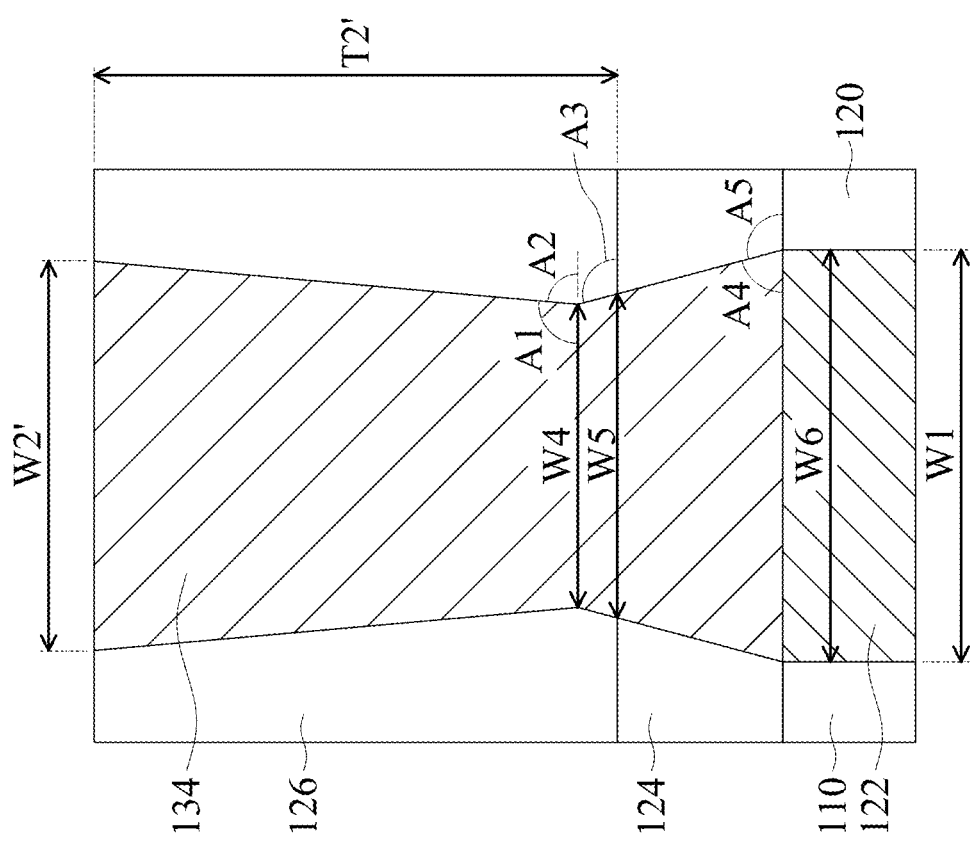

Via 134 are formed in the via opening 129, as shown in FIG. 2F, in accordance with some embodiments. In some embodiments, the vias 134, the etching stop layer 124 and the upper interlayer dielectric layer 126 combine to form one interconnect layer of the multilayer interconnect structure that is formed over and electrically coupled to the previous interconnect layer (including the contact plugs 122 and the lower interlayer dielectric layer 110). The vias 134 land on the contact plugs 122 and are electrically connected to the source/drain features 108, and therefore the vias 134 are also referred to as source/drain vias, in accordance with some embodiments.

The formation of the vias 134 includes depositing one or more conductive materials over the upper interlayer dielectric layer 126 to fill the via opening 129, in accordance with some embodiments. In some embodiments, the conductive materials are deposited using CVD, PVD, e-beam evaporation, ALD, ECP, ELD, another suitable method, or a combination thereof. Afterward, a planarization process such as CMP and/or an etching back process is performed on the one or more conductive materials to remove an excess portion of the conductive materials from the upper surface of the upper interlayer dielectric layer 126. The planarization process may further remove the upper portions of the upper interlayer dielectric layer 126 and the via 134, thereby thinning down the upper interlayer dielectric layer 126 and the vias 134, in accordance with some embodiments. After the planarization process, the upper surfaces of the vias 134 and the upper surface of the upper interlayer dielectric layer 126 are substantially coplanar, in accordance with some embodiments.

The via 134 may have a multilayer structure including, for example, liner layers, glue layers, barrier layers, seed layers, metal bulk layers, another suitable layer, and/or a combination thereof. For example, a barrier layer (not shown) may optionally be formed along the sidewall and the bottom surface of the via opening 129. The barrier layer is used to prevent the metal from the subsequently formed metal material from diffusing into the dielectric material (e.g., the upper interlayer dielectric layer 126 and the etching stop layer 124). The barrier layer may be made of tantalum (Ta), tantalum nitride (TaN), titanium (Ti), titanium nitride (TiN), cobalt tungsten (CoW), another suitable material, and/or a combination thereof. If the subsequently formed metal material does not easily diffuse into the dielectric material, the barrier layer may be omitted.

A glue layer (not shown) may optionally be formed along the sidewall and the bottom surface of the via opening 129, and on the barrier layer (if formed). The glue layer is used to improve adhesion between the subsequently formed metal material and the dielectric material (e.g., the upper interlayer dielectric layer 126 and the etching stop layer 124). The glue layer may be made of tantalum nitride (TaN), titanium (Ti), titanium nitride (TiN), another suitable material, and/or a combination thereof.

A metal bulk layer is then formed on the glue layer (if formed) to fill the remainder of the via opening 129. In some embodiments, the metal bulk layer is formed using a selective deposition technique such as cyclic CVD process or ELD process, and it is not necessary to form a glue layer in the via opening 129 before depositing the metal bulk material. In some embodiments, the metal bulk layers are made of one or more conductive materials with low resistance and good gap-fill ability, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), another suitable metal material, and/or a combination thereof.

FIG. 2F-1 is an enlarged view of a via 134 shown in FIG. 2F, in accordance with some embodiments of the disclosure. The upper portion of the via 134 has a downwardly tapered profile, and the lower portion of the via 134 has an upwardly tapered profile, in accordance with some embodiments. The via opening 129 has an hourglass-shaped profile, in accordance with some embodiments. In some embodiments, the minimum width W4 of the via 134 is at a position between the top surface and the bottom surface of the upper interlayer dielectric layer 126.

In some embodiments, the via 134 has a thickness T2' less about 40 nm, such as, in a range from about 5 nm to about 11 nm, such as about 9 nm. In some embodiments, the via 134 has a width W2' at the top surface of the via 134 in a range from about 12 nm to about 40 nm. In some embodiments, the via 134 has a width W5 at the top surface of the etching stop layer 124 (i.e., the interface between the upper interlayer dielectric layer 126 and the etching stop layer 124) in a range from about 11 nm to about 50 nm. In some embodiments, the via 134 has a width W6 at the bottom surface of the etching stop layer 124 (i.e., the interface between the etching stop layer 124 and the lower interlayer dielectric layer 110 (or the mask layer 120)) in a range from about 11 nm to about 50 nm. In some embodiments, the width W6 is greater than the width W5. In some embodiments, the width W2' is greater than the width W5. The width W6 may be greater than, equal to, or less than the width W2'. In the illustrated embodiments, the width W6 is substantially equal to the width W1 of the contact plug 122. In alternative embodiments, the width W6 may be greater than or less than the width W1.

In some embodiments, the sidewall of the upper portion of the via 134 and a horizontal plane parallel to the upper surface of the lower interlayer dielectric layer 110 intersect at an obtuse angle A1 in a range from about 90 degrees to about 100 degrees, e.g., about 91 degrees to about 93 degrees. In some embodiments, the sidewall of the upper portion of the upper interlayer dielectric layer 126 and the horizontal plane parallel intersect at an acute angle A2 in a range from about 80 degrees to about 90 degrees, e.g., about 87 degrees to about 89 degrees. In some embodiments, the sidewall of the lower portion of the upper interlayer dielectric layer 126 and its bottom surface intersect at an obtuse angle A3 in a range from about 90 degrees to about 120 degrees, e.g., about 91 degrees to about 110 degrees.

In some embodiments, the sidewall of the lower portion of the via 134 and its bottom surface intersect at an acute angle A4 in a range from about 60 degrees to about 90 degrees, e.g., about 70 degrees to about 89 degrees. In some embodiments, the sidewall and the bottom surface of the etching stop layer 124 intersect at an obtuse angle A5 in a range from about 90 degrees to about 120 degrees, e.g., about 91 degrees to about 110 degrees.

By enhancing the lateral etching amount in the over-etching step for forming the via opening 129, the via 134 can be formed with a relatively wide bottom portion. Therefore, the resistance of the via 134 may be lowered, which may improve the performance (such as speed) of the resulting semiconductor device.

Figure 2G:
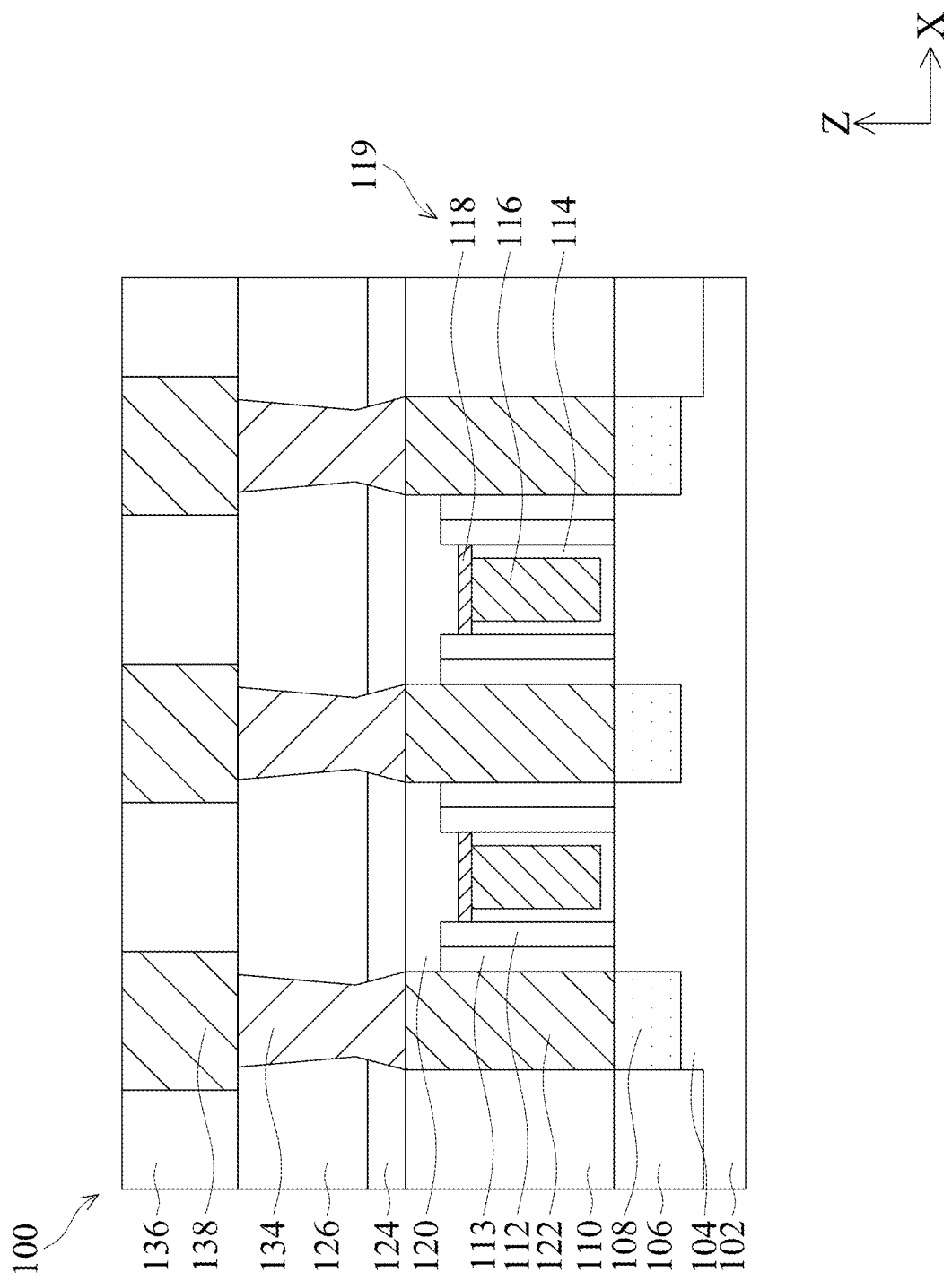

An intermetal dielectric (IMD) layer 136 is formed over the vias 134 and the upper interlayer dielectric layer 126, as shown in FIG. 2G, in accordance with some embodiments. In some embodiments, the intermetal dielectric layer 136 is made of one or more dielectric materials, such as silicon oxide (SiO), silicon nitride (SiN), silicon oxynitride (SiON), silicon carbide (SiC), aluminum oxide ($Al_2O_3$), dielectric material(s) with low dielectric constant (low-k) such as SiCOH, SiOCN, and/or SiOC, and/or a combination thereof.

In some embodiments, the intermetal dielectric layer 136 is made of an extreme low-k (ELK) dielectric material with a dielectric constant (k) less than about 3.0, or even less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the intermetal dielectric layer 136 is formed using CVD (such as LPCVD, HARP, and FCVD), ALD, spin-on coating, another suitable method, or a combination thereof. A post-curing process (e.g., UV curing) may be performed on the as-deposited ELK dielectric material for the intermetal dielectric layer 136 to form a porous structure.

In some embodiments, the intermetal dielectric layer 136 is made of a single, continuous material, as shown in FIG. 2G. In some embodiments, the intermetal dielectric layer 136 may be a multilayer structure. For example, the intermetal dielectric layer 136 may include a bottom lining layer to serve as an etching stop layer and a bulk layer having low-k dielectric constant over the bottom lining layer. The bottom lining layer may be made of a dielectric material having a different etching selectivity from the bulk layer.

Metal lines 138 are formed in and/or through the intermetal dielectric layer 136, as shown in FIG. 2G, in accordance with some embodiments. In some embodiments, the metal lines 138 and the intermetal dielectric layer 136 combine to form one interconnect layer of the multilayer interconnect structure that is formed over and electrically coupled to the previous interconnect layer (including the vias 134, the etching stop layer 124 and the upper interlayer dielectric layer 126). The metal lines 138 correspond to and are electrically connected to the vias 134, in accordance with some embodiments.

In some embodiments, the formation of the metal lines 138 includes patterning the intermetal dielectric layer 136 to form trenches (where the metal lines 138 are to be formed) through the intermetal dielectric layer 136 and exposing the vias 134. The patterning process may include forming a patterned mask layer (such as a photoresist layer and/or a hard mask layer, not shown) on the intermetal dielectric layer 136, and etching the intermetal dielectric layer 136 uncovered by the patterned mask layer. For example, a photoresist may be formed on the intermetal dielectric layer 136, such as by using spin-on coating, and patterned with patterns corresponding to the trenches by exposing the photoresist to light using an appropriate photomask. Exposed or unexposed portions of the photoresist may be removed depending on whether a positive or negative resist is used.

The patterns of the photoresist may then be transferred to the intermetal dielectric layer 136, such as by using one or more suitable etch processes. The photoresist can be removed in an ashing or wet strip process, for example. Alternatively, a hard mask layer may be formed on the intermetal dielectric layer 136. The hard mask layer may include, or be formed of, a nitrogen-free anti-reflection layer (NFARL), carbon-doped silicon dioxide (e.g., $SiO_2$:C), titanium nitride (TiN), titanium oxide (TiO), boron nitride (BN), a multilayer thereof, another suitable material, and/or a combination thereof. The hard mask layer may be patterned using photolithography and etching processes described above to have patterns corresponding to the trenches. The patterned hard mask layer may transfer the patterns to the intermetal dielectric layer 136 to form the trenches, which may be accomplished by using one or more suitable etch processes. The etch processes may include dry etching such as a reactive ion etch (RIE), neutral beam etch (NBE), inductive coupled plasma (ICP) etch, capacitively coupled plasma (CCP) etch, another suitable method, or a combination thereof. The etch processes may be anisotropic.

One or more conductive materials for the metal lines 138 are then deposited over the intermetal dielectric layer 136 to fill the trenches. In some embodiments, the conductive material is deposited using CVD, PVD, e-beam evaporation, ALD, ECP, ELD, another suitable method, or a combination thereof. Afterward, a planarization process such as CMP and/or an etching back process is performed on the one or more conductive materials to remove an excess portion of the conductive materials from the upper surface of the intermetal dielectric layer 136. After the planarization process, the upper surfaces of the metal lines 138 and the intermetal dielectric layer 136 are substantially coplanar, in accordance with some embodiments. The planarization process may also remove the patterned hard mask layer.

The metal lines 138 may have a multilayer structure including, for example, liner layers, glue layers, barrier layers, seed layers, metal bulk layers, another suitable layer, and/or a combination thereof. For example, a barrier layer (not shown) may optionally be formed along the sidewalls and the bottom surfaces of the trenches. The barrier layer is used to prevent the metal from the subsequently formed metal material from diffusing into the dielectric material (e.g., the intermetal dielectric layer 136). The barrier layer may be made of tantalum (Ta), tantalum nitride (TaN), titanium (Ti), titanium nitride (TiN), cobalt tungsten (CoW), another suitable material, and/or a combination thereof. If the subsequently formed metal material does not easily diffuse into the dielectric material, the barrier layer may be omitted.

A glue layer (not shown) may optionally be formed along the sidewalls and the bottom surfaces of the trenches, and on the barrier layer (if formed). The glue layer is used to improve adhesion between the subsequently formed metal material and the dielectric material (e.g., the intermetal dielectric layer 136). The glue layer may be made of tantalum nitride (TaN), titanium (Ti), titanium nitride (TiN), another suitable material, and/or a combination thereof.

A metal bulk layer is then formed on the glue layer (if formed) to fill the remainder of the trenches. In some embodiments, the metal bulk layer is formed using a selective deposition technique such as cyclic CVD process or ELD process, and it is not necessary to form a glue layer in the trenches before depositing the metal bulk material. In some embodiments, the metal bulk layers are made of one or more conductive materials with low resistance and good gap-fill ability, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), another suitable metal material, and/or a combination thereof.

After the metal lines 138 are formed, additional interconnect layers (including such as intermetal dielectric layers and electrically conductive features e.g., metal lines and vias) of the multilayer interconnect structure may be formed over the semiconductor structure 100 to produce a semiconductor device. Furthermore, the aspect of the embodiments for forming the conductive feature with a wide bottom portion, described above with respect to FIGS. 2C to 2F, may also be used for the additional conductive features.

Figure 3A:
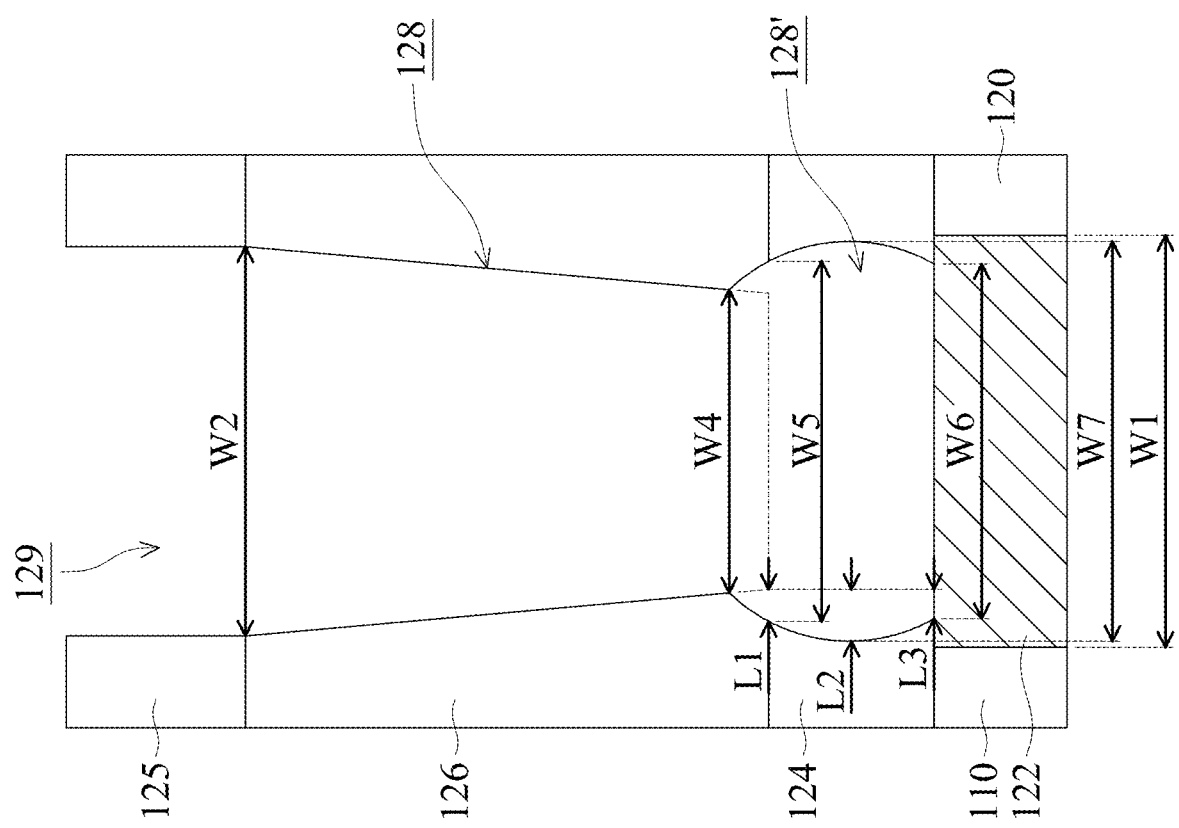
FIG. 3A is a modification of FIG. 2E-1 in accordance with some embodiments.
Figure 3B:
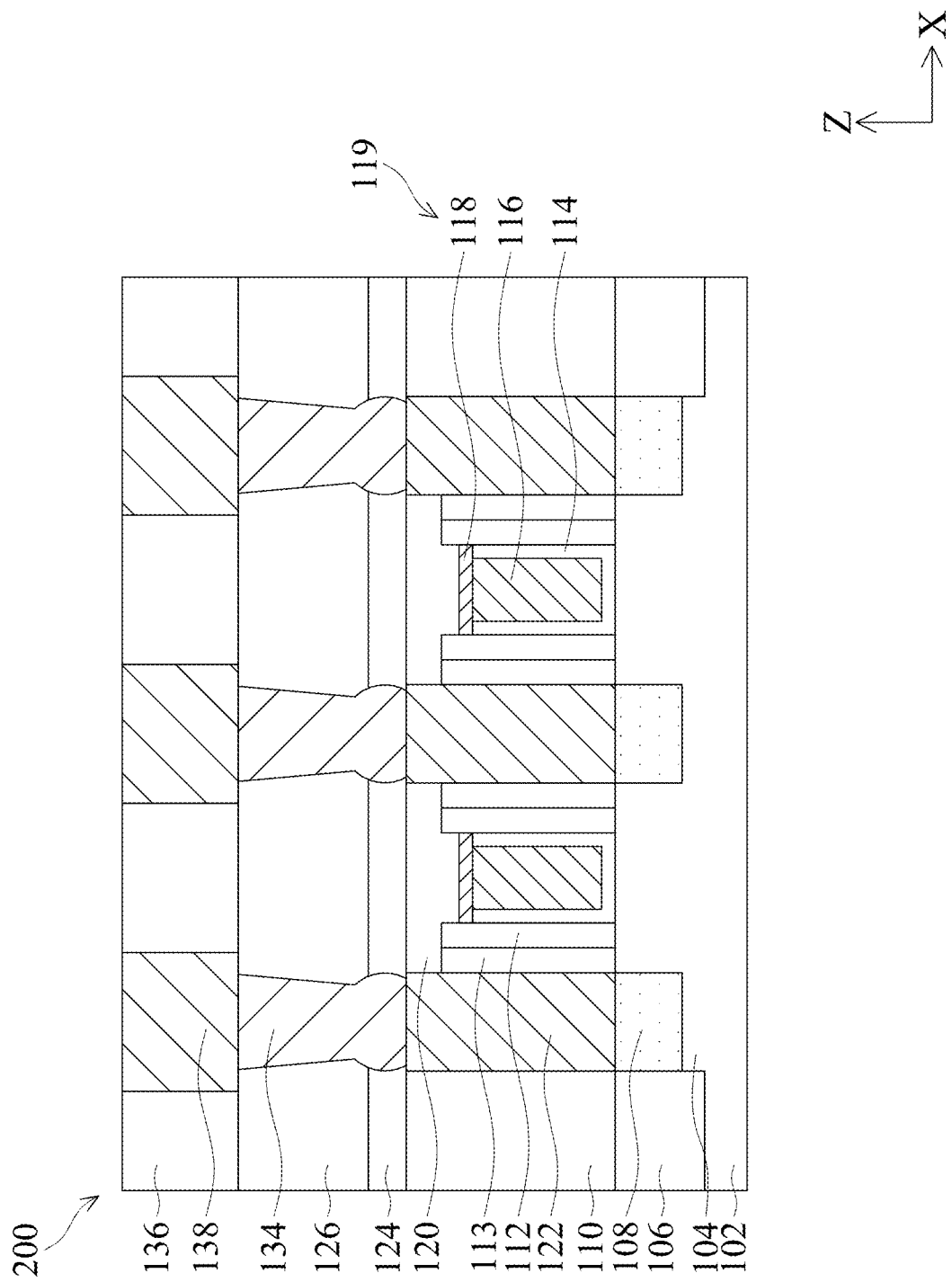
FIG. 3B is a cross-sectional view of a semiconductor structure, in accordance with some embodiments of the disclosure.
Figures 1, 3B:
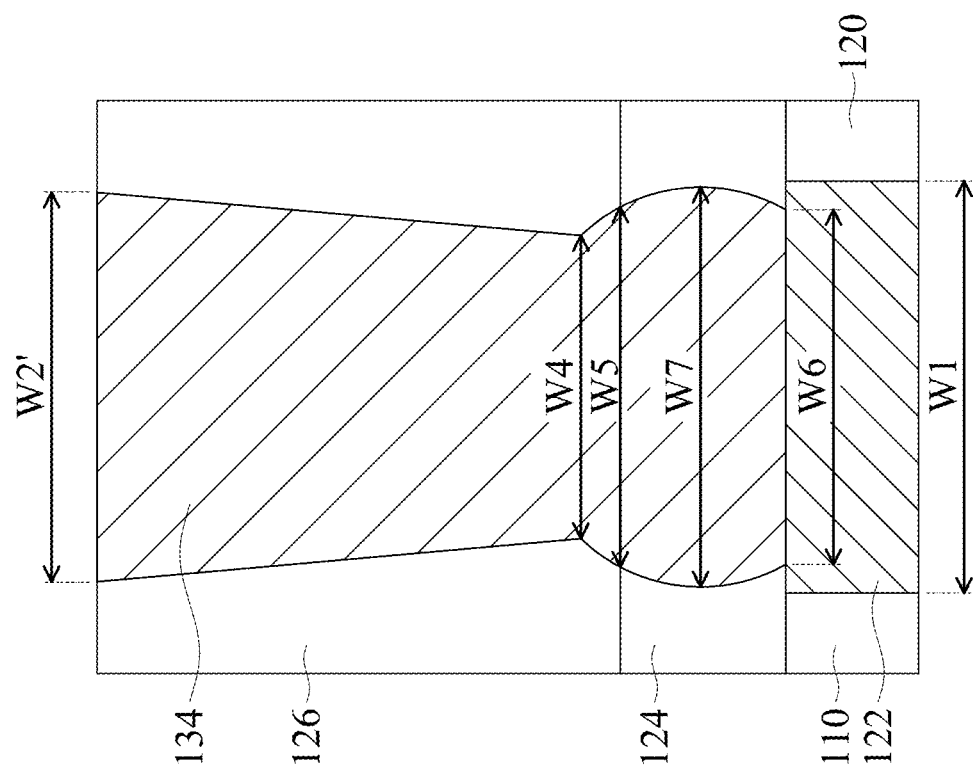

FIGS. 3A-3B are cross-sectional views illustrating the formation of a semiconductor structure 200 at various intermediate stages, in which FIG. 3A is a modification of FIG. 2E-1, in accordance with some embodiments. The embodiments of the FIG. 3A-3B are similar to the embodiments of the FIGS. 2A-2G, except that the extension portion 128' of the via opening 129 has curved sidewalls.

The lateral etching amount of the second etching step may be adjusting by adjusting the process parameters of the second etching step, e.g., the flow rate, the pressure, the duration, another suitable parameter, and/or a combination thereof, thereby modifying the profile of the cross-section of the extension portion 128'.

For example, the first lateral etching amount L1 (at the top surface of the etching stop layer 124) is less than the second lateral etching amount L2 (at the middle height of the etching stop layer 124), and the second lateral etching amount L2 is greater than the third lateral etching amount L3 (at the bottom surface of the etching stop layer 124).

The extension portion 128' of the via opening 129 has a curved profile, e.g., convex toward the etching stop layer 124, in accordance with some embodiments. In some embodiments, the extension portion 128' has width W7 at the middle height of the etching stop layer 124, and the width W7 is greater than the width W5 (at the top surface of the etching stop layer 124) and the width W6 (at the bottom surface of the etching stop layer 124) of the extension portion 128'. In some embodiments, the width W7 is greater than the width W2 (at the top surface of the upper interlayer dielectric layer 124) of the via opening 129. In some embodiments, the width W6 of the via opening 129 is less than the width W1 of the contact plug 122. In some embodiments, the minimum width W4 of the via opening 129 is at a position between the top surface and the bottom surface of the upper interlayer dielectric layer 126.

The steps described above with respect to FIGS. 2F-2G are performed, thereby forming the vias 134, the intermetal dielectric layer 136 and the metal lines 138, as shown in FIG. 3B, in accordance with some embodiments. FIG. 3B-1 is an enlarged view of a via 134 shown in FIG. 3B, in accordance with some embodiments of the disclosure. In some embodiments, the width W7 of the via 134 (at the middle height of the etching stop layer 124) is greater than the width W5 (at the top surface of the etching stop layer 124) and the width W6 (at the bottom surface of the etching stop layer 124) of the via 134. In some embodiments, the width W6 of the via 134 may be less than the width W1 of the contact plug 122. In some embodiments, the minimum width W4 of the via 134 is at a position between the top surface and the bottom surface of the upper interlayer dielectric layer 126.

Figure 4A:
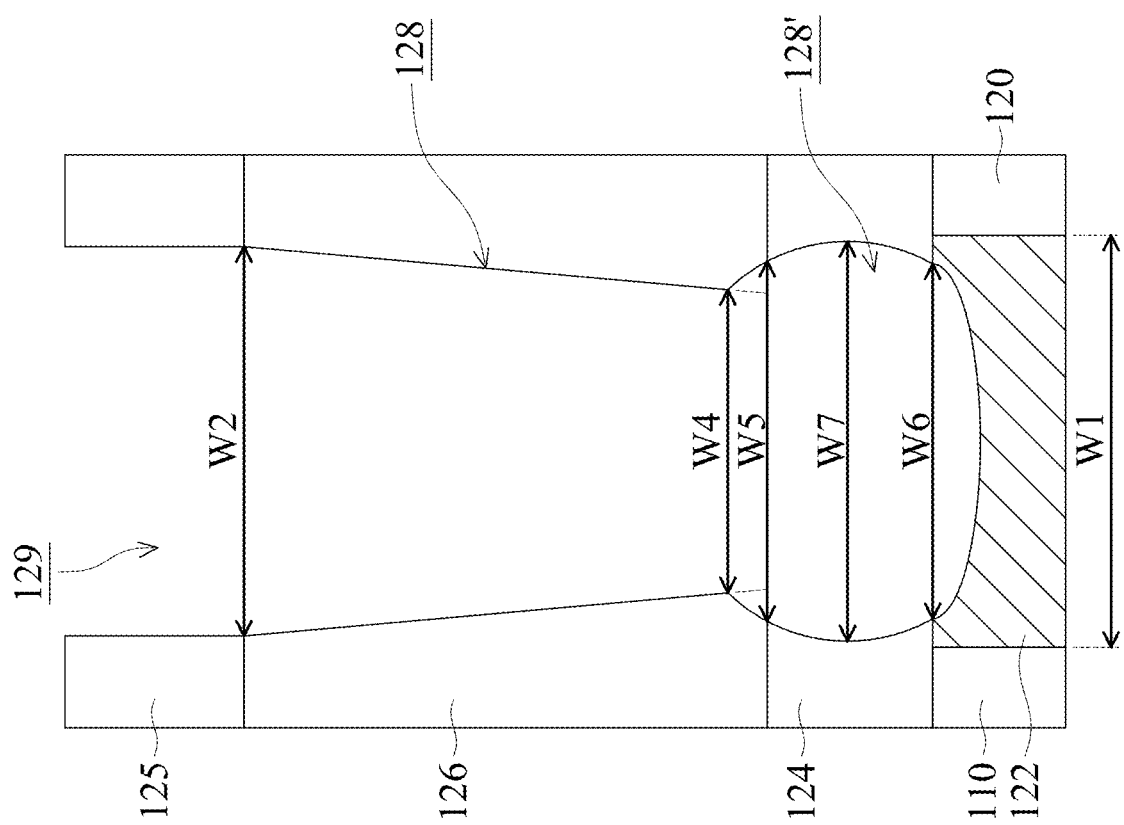
FIG. 4A is a modification of FIG. 3A in accordance with some embodiments.
Figure 4B:
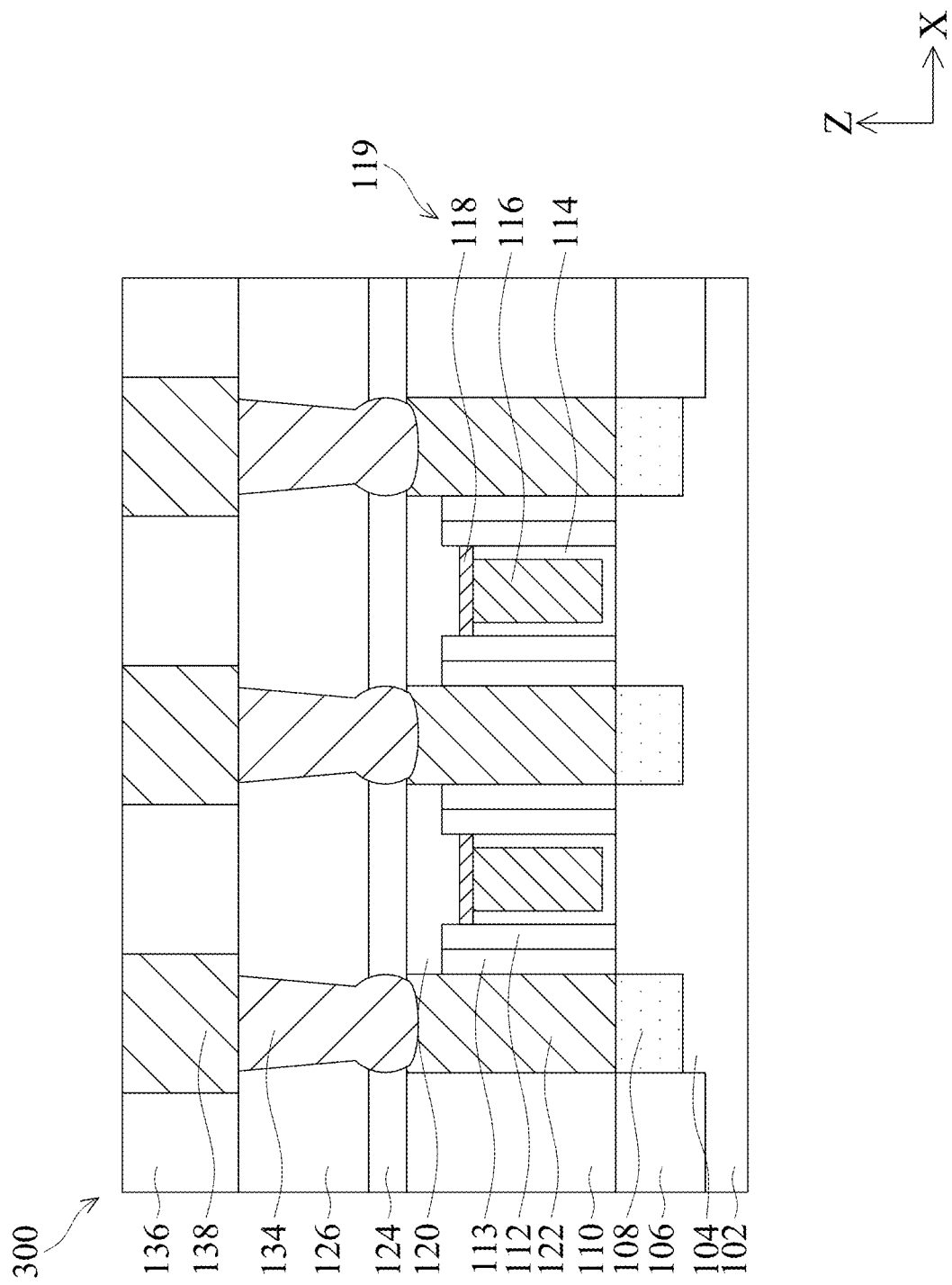
FIG. 4B is a cross-sectional view of a semiconductor structure, in accordance with some embodiments of the disclosure.

FIGS. 4A-4B are cross-sectional views illustrating the formation of a semiconductor structure 300 at various intermediate stages, in which FIG. 4A is a modification of FIG. 3A, in accordance with some embodiments. In some embodiments, the upper portion of the contact plug 122 is also recessed during the second etching step. As a result, the top surface of the contact plug 122 has a concave surface that is between substantially planar surfaces, in accordance with some embodiments.

The steps described above with respect to FIGS. 2F-2G are performed, thereby forming the vias 134, the intermetal dielectric layer 136 and the metal lines 138, as shown in FIG. 4B, in accordance with some embodiments. The vias 134 has a bottom portion embedded in the contact plug 122, in accordance with some embodiments.

Figure 5A:
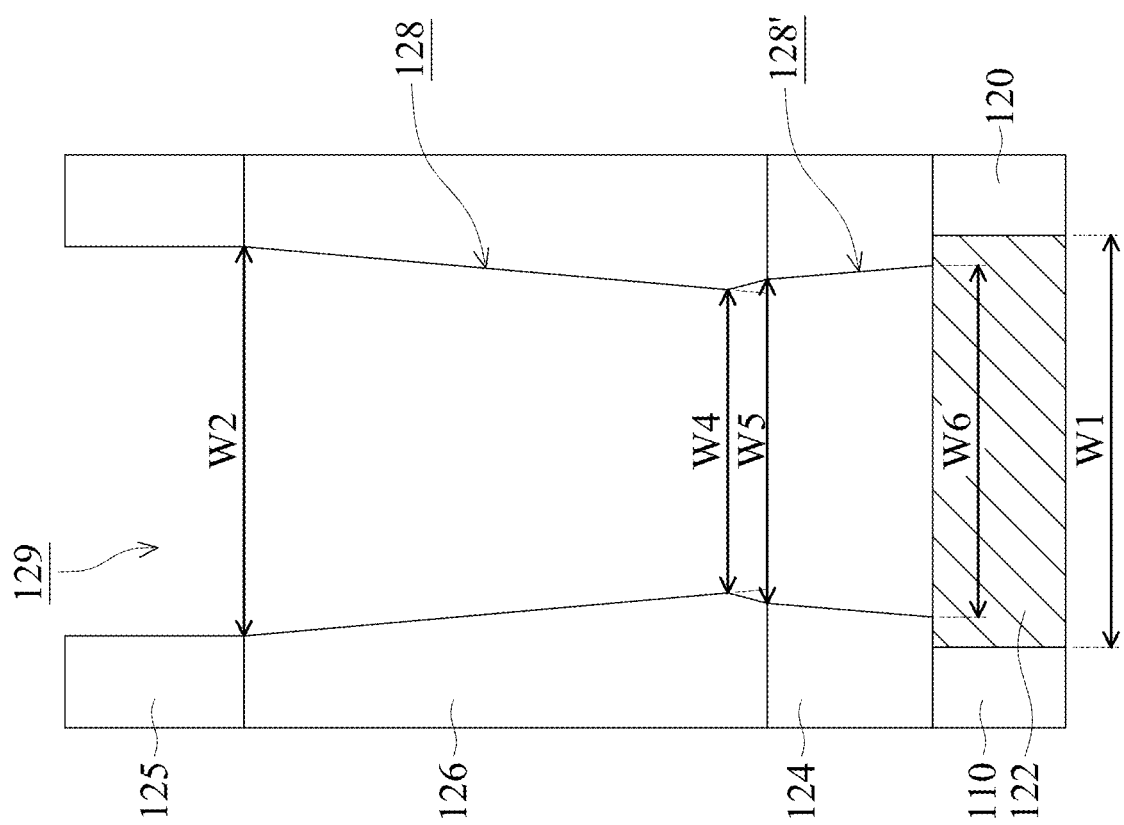
FIG. 5A is a modification of FIG. 2E-1 in accordance with some embodiments.
Figure 5B:
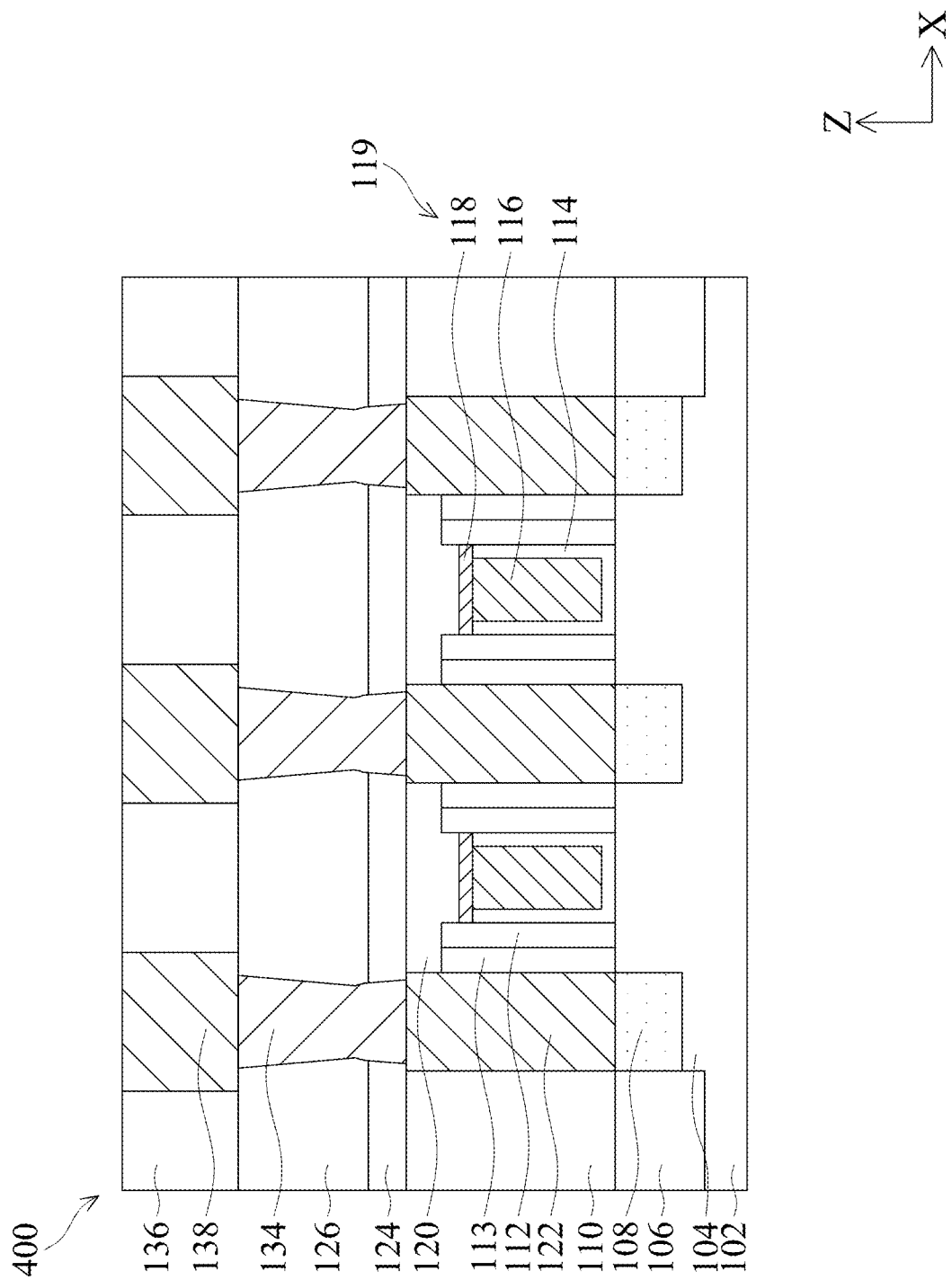
FIG. 5B is a cross-sectional view of a semiconductor structure, in accordance with some embodiments of the disclosure.

FIGS. 5A-5B are cross-sectional views illustrating the formation of a semiconductor structure 400 at various intermediate stages, in which FIG. 5A is a modification of FIG. 2E-1, in accordance with some embodiments. In some embodiments, the width W6 of the via opening 129 is less than the width W1 of the contact plug 122.

The steps described above with respect to FIGS. 2F-2G are performed, thereby forming the vias 134, the intermetal dielectric layer 136 and the metal lines 138, as shown in FIG. 5B, in accordance with some embodiments. In some embodiments, the width W6 of the via 134 is less than the width W1 of the contact plug 122.

Figure 6A:
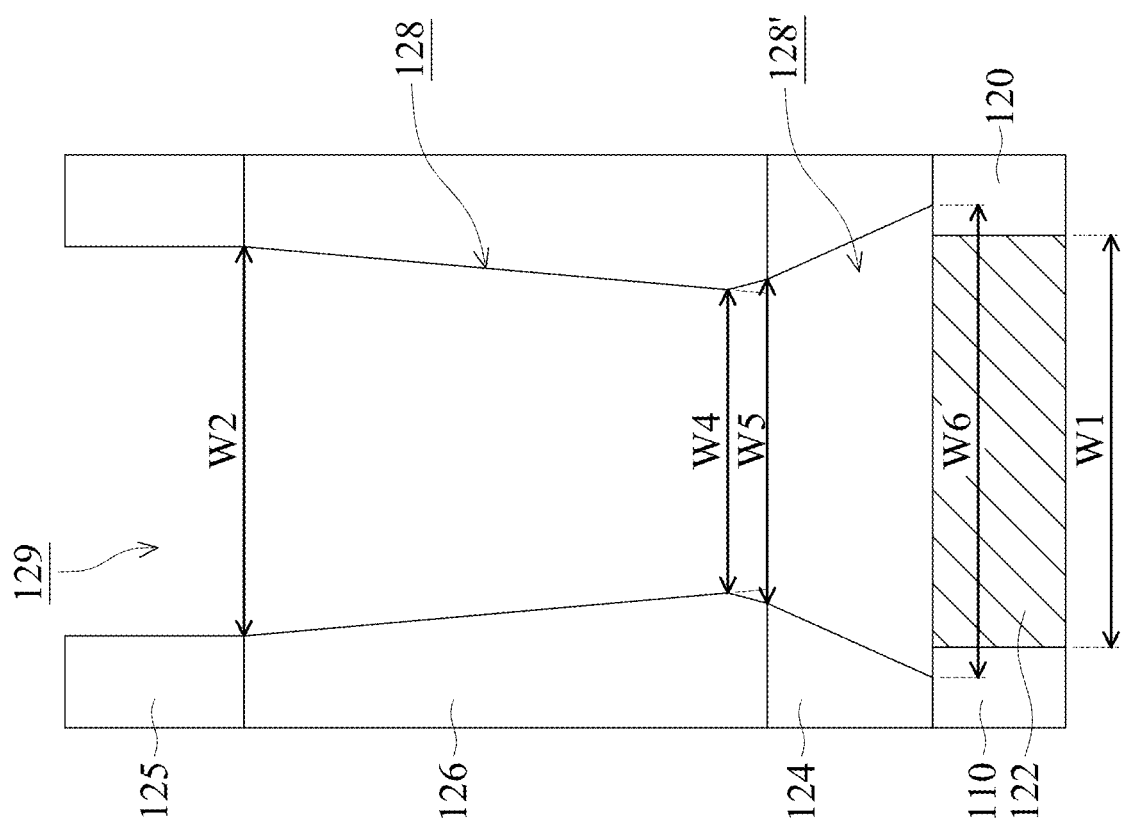
FIG. 6A is a modification of FIG. 2E-1 in accordance with some embodiments.
Figure 6B:
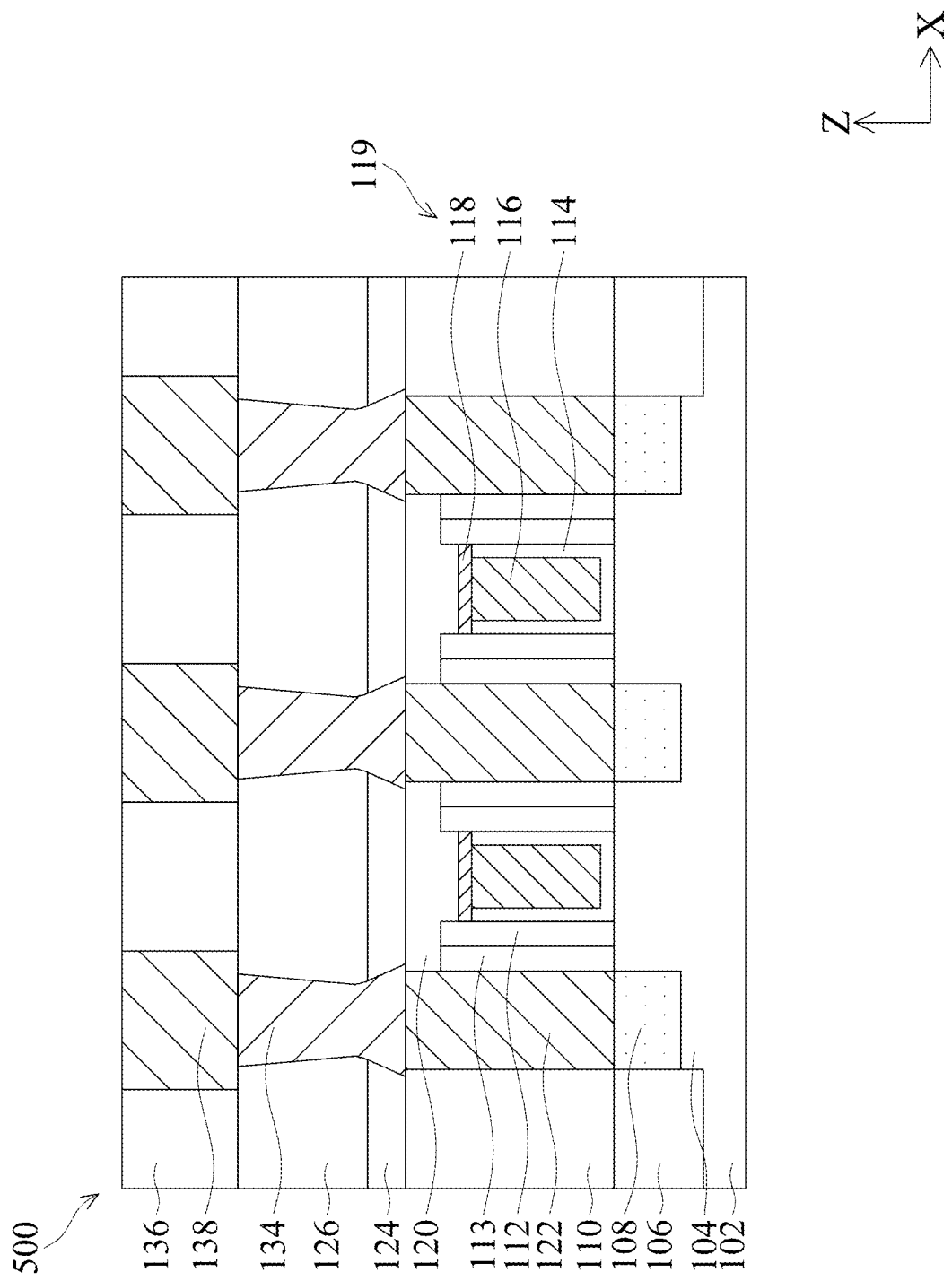
FIG. 6B is a cross-sectional view of a semiconductor structure, in accordance with some embodiments of the disclosure.

FIGS. 6A-6B are cross-sectional views illustrating the formation of a semiconductor structure 500 at various intermediate stages, in which FIG. 6A is a modification of FIG. 2E-1 in accordance with some embodiments. In some embodiments, the width W6 of the via opening 129 is greater than the width W1 of the contact plug 122. The extension portion 128' of the via opening 129 also partially exposes the lower interlayer dielectric 110 and/or the mask layer 120, in accordance with some embodiments.

The steps described above with respect to FIGS. 2F-2G are performed, thereby forming the vias 134, the intermetal dielectric layer 136 and the metal lines 138, as shown in FIG. 6B, in accordance with some embodiments. In some embodiments, the width W6 of the via 134 is greater than the width W1 of the contact plug 122. The via 134 also partially covers the lower interlayer dielectric 110 and/or the mask layer 120, in accordance with some embodiments.

Figure 7A:
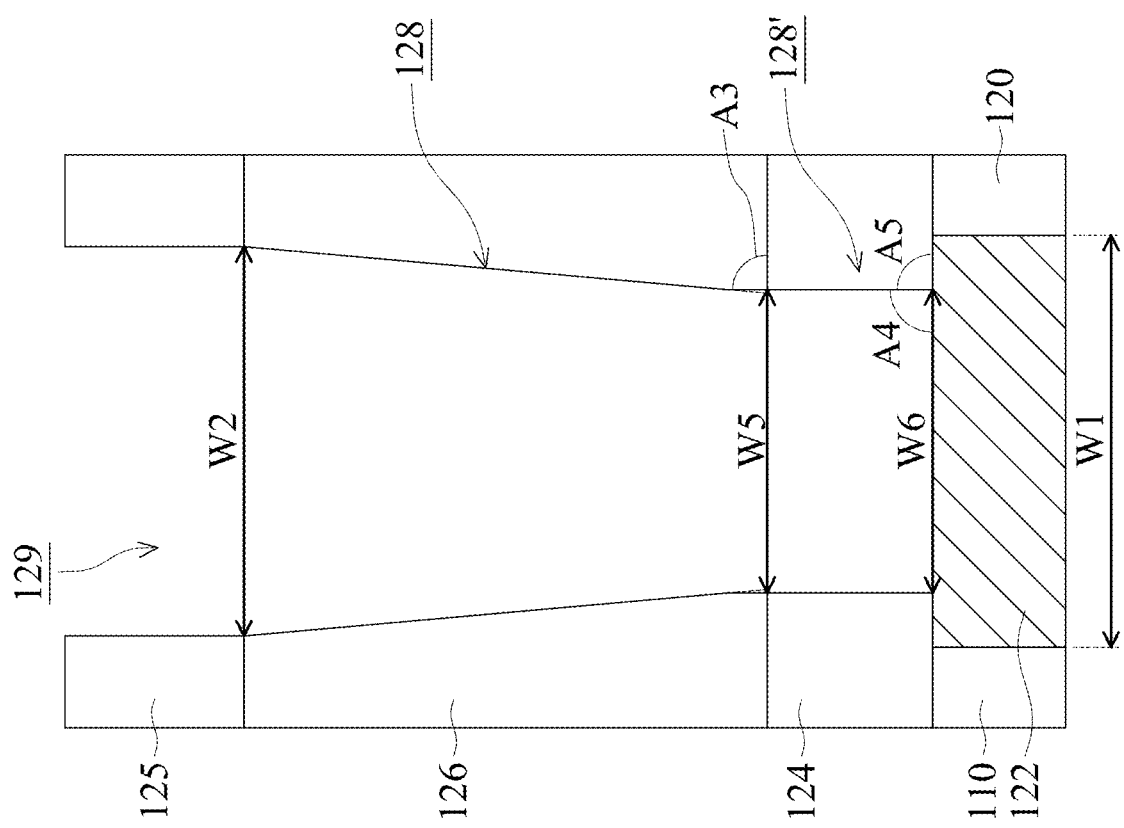
FIG. 7A is a modification of FIG. 2E-1 in accordance with some embodiments.
Figure 7B:
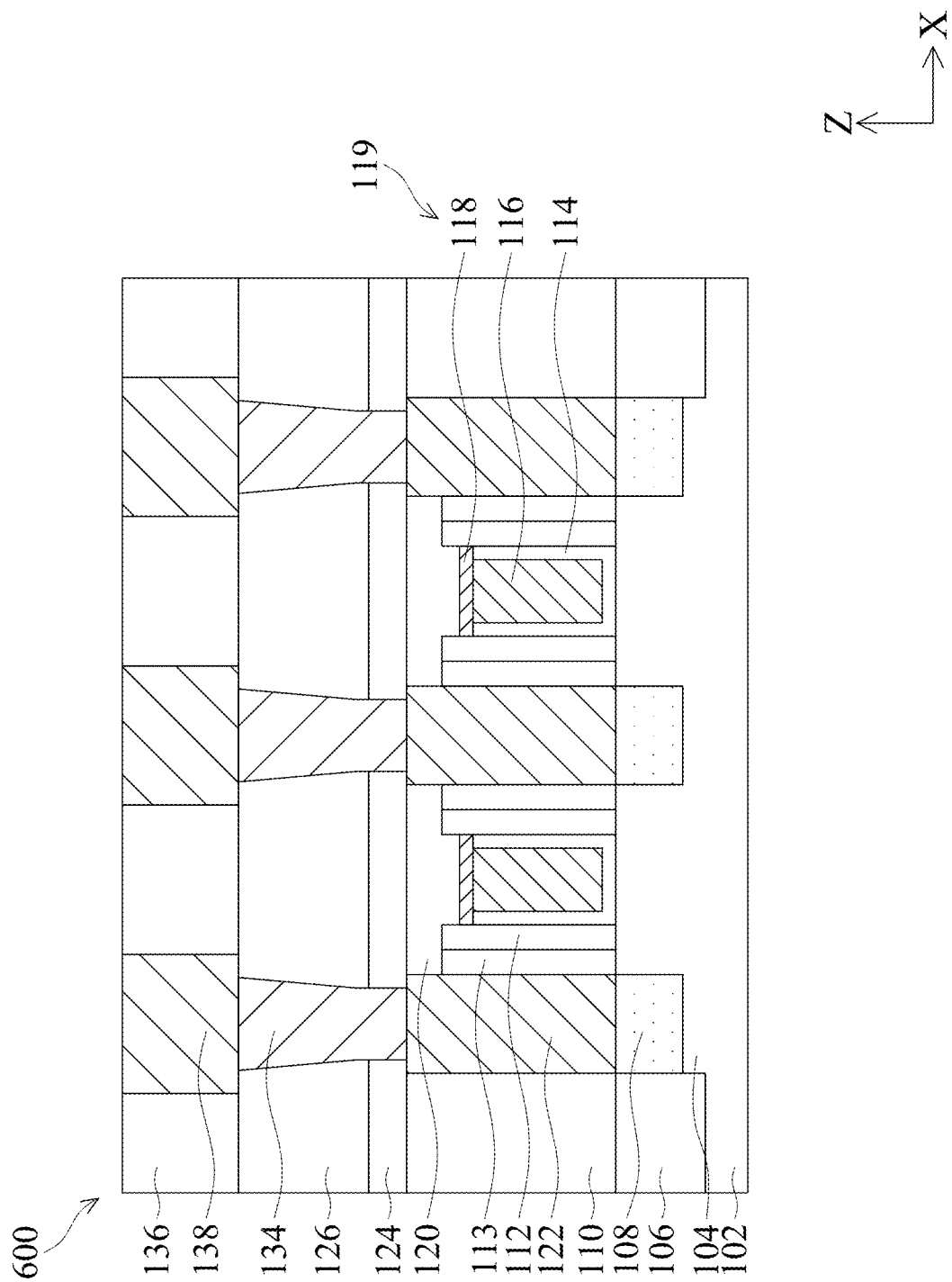
FIG. 7B is a cross-sectional view of a semiconductor structure, in accordance with some embodiments of the disclosure.

FIGS. 7A-7B are cross-sectional views illustrating the formation of a semiconductor structure 600 at various intermediate stages, in which FIG. 7A is a modification of FIG. 2E-1 in accordance with some embodiments. In some embodiments, the width W6 of the via opening 129 is substantially equal to the width W5 of the via opening 129. In some embodiments, the sidewall and the bottom surface of the extension portion 128' (or the via opening 129) intersect at a right angle A4 (90 degrees). In some embodiments, the sidewall (exposed from the extension portion 128') and the bottom surface of the etching stop layer 124 intersect at a right angle A5 (90 degrees).

The steps described above with respect to FIGS. 2F-2G are performed, thereby forming the vias 134, the intermetal dielectric layer 136 and the metal lines 138, as shown in FIG. 7B, in accordance with some embodiments.

Figure 8:
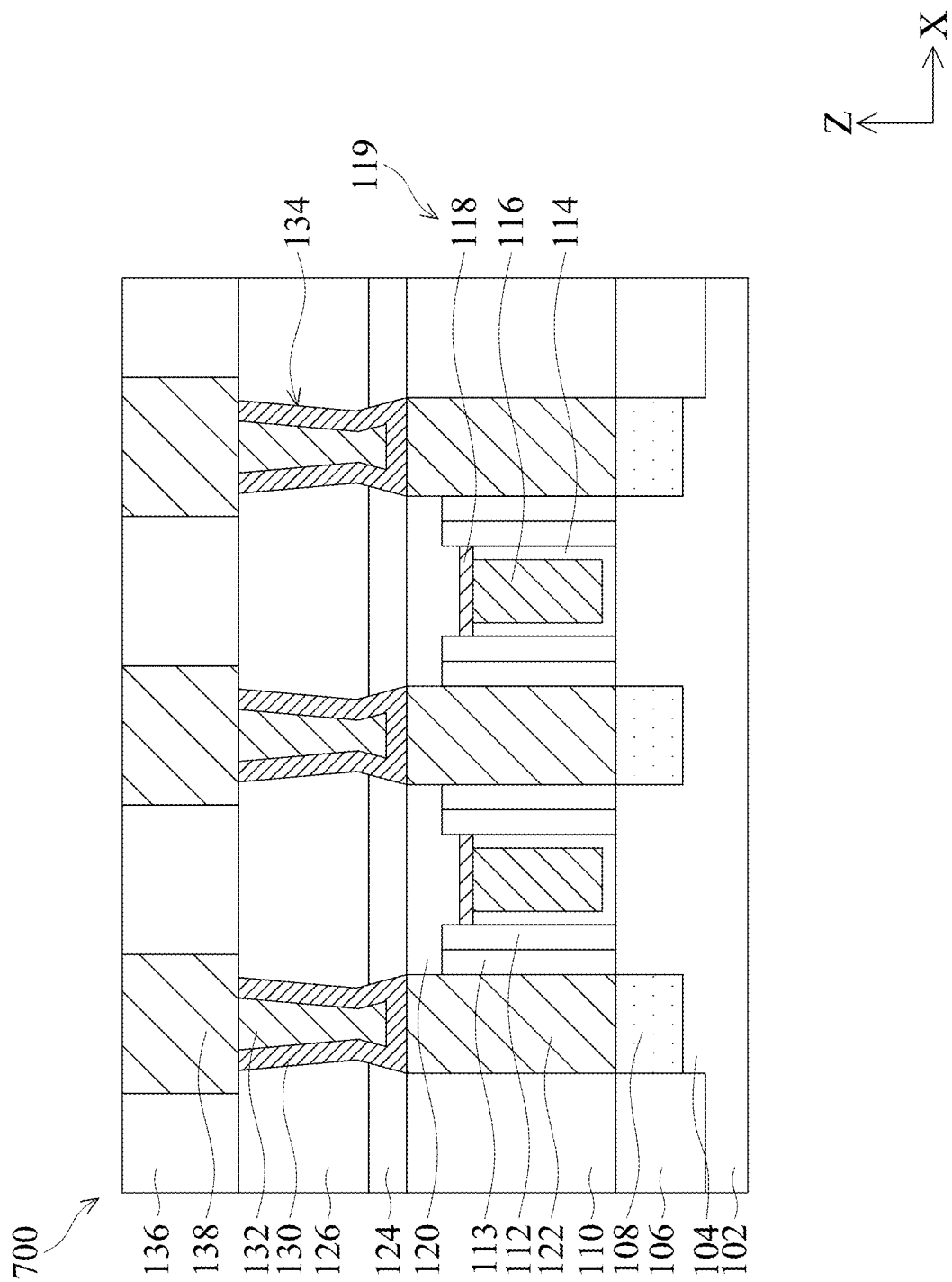
FIG. 8 is a cross-sectional view of a semiconductor structure, in accordance with some embodiments of the disclosure.

FIG. 8 is a cross-sectional view of a semiconductor structure 700, in accordance with some embodiments of the disclosure. The semiconductor structure 700 is substantially the same as the semiconductor structure 100, except that the vias 134 includes a barrier layer 130 and a metal bulk layer 132 formed over the barrier layer 130, in accordance with some embodiments. The materials and the formation method of the barrier layer 130 and the metal bulk layer 132 may be similar to or the same as those described above.

Figure 9:
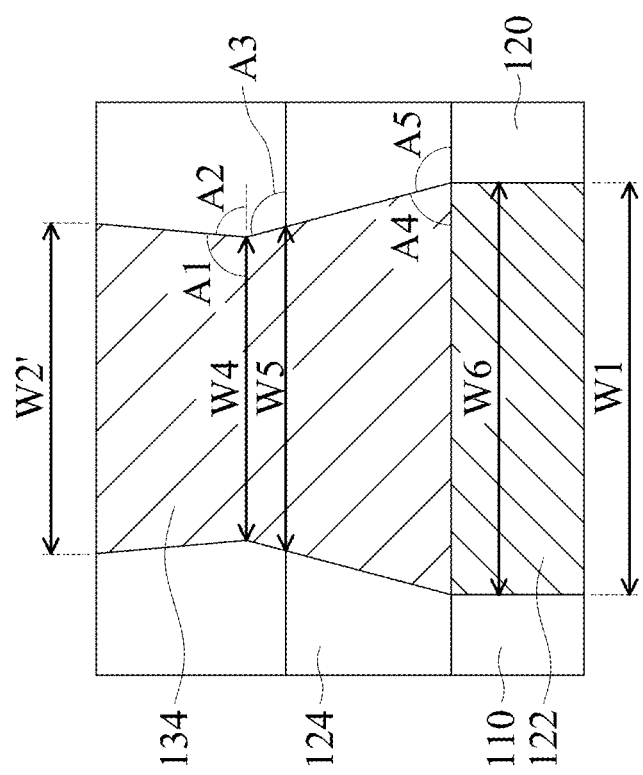
FIG. 9 is a modification of FIG. 2F-1 in accordance with some embodiments.

FIG. 9 is a modification of FIG. 2F-1, in accordance with some embodiments. After the conductive material for the vias 134 is deposited, the planarization process is performed to remove the excess portion of the conductive materials from the upper surface of the upper interlayer dielectric layer 126, in accordance with some embodiments. The planarization process further removes the upper portions of the upper interlayer dielectric layer 126 and the via 134, thereby thinning down the upper interlayer dielectric layer 126 and the vias 134, in accordance with some embodiments. As a result, the width W2' of the via 134 (at the top surface of the upper interlayer dielectric layer 126) is less than the width W6 of the via 134 (at the bottom surface of the etching stop layer 124), in accordance with some embodiments. In some embodiments, the width W2' of the via 134 is less than the width W5 of the via 134 (at the top surface of the etching stop layer 124).

Figure 10:
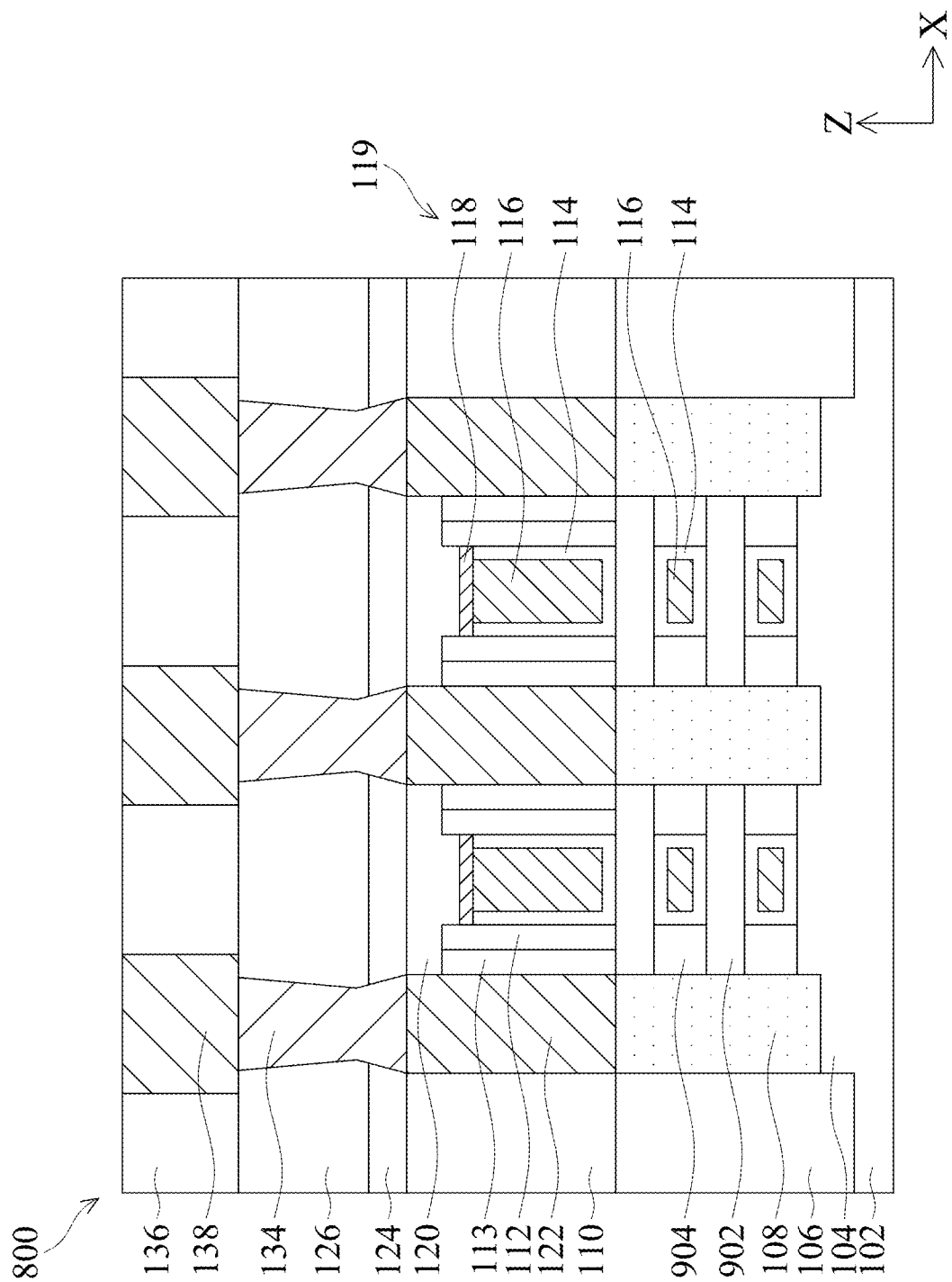
FIG. 10 is a cross-sectional view of a semiconductor structure, in accordance with some embodiments of the disclosure.

The disclosed FinFET embodiments could also be applied to nanostructure devices such as nanostructure (e.g., nanosheet, nanowire, gate-all-around (GAA), or the like) field effect transistors (NSFETs). FIG. 10 illustrates a cross-sectional view of a semiconductor structure 800 including a NSFET device.

In NSFET embodiments, the fin structure 104 is formed by forming a stack of alternating layers of channel layers 902 and sacrificial layers (not shown) over the substrate 102, and patterning the stack and the substrate 102 into the fin structure 104. In some embodiments, the sacrificial layers are made of SiGe, and the channel layers 902 are made of pure or substantially pure silicon. The dummy gate structures, the gate spacer layers 112 and 113, the source/drain features 108 and the lower interlayer dielectric layer 110 are formed in a manner similar to the above-described embodiments. Before the source/drain features 108 are formed, inner spacers 904 are formed between the channel layers 902 and below the gate spacer layers 112 and 113 by laterally recessing the sacrificial layers to form notches and depositing a dielectric material in the notches, in accordance with some embodiments. After the dummy gate stacks are removed, the sacrificial layers can be fully removed, thereby exposing four main surfaces of the channel layers 902, in accordance with some embodiments. The channel layers 902 form nanostructures (e.g., nanowires or nanosheets) that function as channel layers of the NSFET device, in accordance with some embodiments. The gate stacks 119 and the mask layers 120 are formed in a manner similar to the above-described embodiments. The gate stacks 119 wrap around the exposed surface of the nanostructures 902.

A multilayer interconnect structure including the contact plugs 122, the etching stop layer 124, the upper interlayer dielectric layer 126, vias 134, the intermetal dielectric layer 136, the metal lines 138 is formed in a manner similar to the above-described embodiments. In addition, the modification as described above with respect to FIGS. 3A, 4A, 5A, 6A, 7A, 8 and 9 can be made to the NSFET embodiment shown in FIG. 9.

As described above, the method for forming a semiconductor structure includes etching the upper interlayer dielectric layer 126 to form the via opening 128, etching the etching stop layer 124 to enlarge the via opening, and forming the via 134 in the via opening. Etching the etching stop layer 124 includes using $H_2$ as a carrier gas to improve the etching isotropy. As a result, the etching stop layer is laterally etched a first lateral etching amount L1 at the top surface of the etching stop layer 124 and is laterally etched a second lateral etching amount L3 at a bottom surface of the etching stop layer 124, and the second lateral etching amount L3 is greater than the first lateral etching amount L2. By enhancing the lateral etching amount, the via 134 may be formed with a relatively wide bottom portion. Therefore, the resistance of the via 134 may be lowered, which may improve the performance of the resulting semiconductor device.

Embodiments of a method for forming a semiconductor structure are provided. The method for forming the semiconductor structure may include etching the interlayer dielectric layer to form an opening exposing the etching stop layer, and a first width of the opening at a top surface of the interlayer dielectric layer is greater than a second width of the opening at a bottom surface of the interlayer dielectric layer. The method for forming the semiconductor structure may further include etching the etching stop layer until the opening extends to the conductive feature, thereby forming an enlarged opening, and a third width of the enlarged opening at a top surface of the etching stop layer is equal to or less than a fourth width of the enlarged opening at a bottom surface of the etching stop layer. The method for forming the semiconductor structure may further include forming a metal material in the enlarged opening. Therefore, the resistance of the resulting via may be lowered, which may improve the performance of the resulting semiconductor device.

In some embodiments, a semiconductor structure is provided. The semiconductor structure includes a contact plug on a source/drain region of a transistor, and a via on the contact plug. The via includes a lower portion and an upper portion over the lower portion, the lower portion of the via tapers upward, and the upper portion of the via tapers downward. The semiconductor structure further includes a metal line on the via.

In some embodiments, a semiconductor structure is provided. The semiconductor structure includes a source/drain feature abutting a channel layer, a gate stack surrounding the channel layer, a contact plug on the source/drain feature, and a via on the contact plug and electrically connected to the source/drain feature. The via includes a lower portion and an upper portion over the lower portion, the lower portion of the via has a first sidewall that is curved, and the upper portion of the via has a second sidewall that is linear, and the first sidewall is connected to the second sidewall.

In some embodiments, a method for forming a semiconductor structure is provided. The method includes forming a transistor over a substrate, forming a contact plug on a source/drain region of transistor, forming a first dielectric layer over the contact plug, forming a second dielectric layer over the first dielectric layer, etching the second dielectric layer to form an upper portion of an opening, and etching the first dielectric layer to form a lower portion of the opening. The lower portion of the opening tapers upward. The method further includes forming a via in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a contact plug above a source/drain region of a transistor, wherein a top surface of the contact plug is higher than a top surface of a gate stack of the transistor;
   a via above a top surface of the contact plug, wherein the via includes a lower portion and an upper portion over the lower portion, the lower portion of the via tapers upward, and the upper portion of the via tapers downward; and
   a metal line above a top surface of the via.

2. The semiconductor structure as claimed in claim 1, further comprising:
   a first dielectric layer, wherein the contact plug is located in the first dielectric layer;
   a second dielectric layer over the first dielectric layer; and
   a third dielectric layer over second dielectric layer and having a lower dielectric constant than the second dielectric layer, wherein the via is located in the third dielectric layer and the second dielectric layer.

3. The semiconductor structure as claimed in claim 2, wherein the lower portion of the via tapers upward from a bottom surface of the second dielectric layer to a first position that is between a bottom surface and a top surface of the third dielectric layer, and the upper portion of the via tapers downward from the top surface of the third dielectric layer to the first position.

4. The semiconductor structure as claimed in claim 2, wherein the via has a first width measured at a bottom surface of the second dielectric layer, the contact plug has a second width measured at a top surface of the first dielectric layer, and the first width is greater than the second width.

5. The semiconductor structure as claimed in claim 2, wherein the via has a first width measured at a bottom surface of the second dielectric layer, the contact plug has a second width measured at a top surface of the first dielectric layer, and the first width is less than the second width.

6. The semiconductor structure as claimed in claim 2, wherein the via has a first width measured at a bottom surface of the second dielectric layer, the contact plug has a second width measured at a top surface of the first dielectric layer, and the first width is substantially equal to the second width.

7. The semiconductor structure as claimed in claim 6, wherein the via has a third width measured at the top surface of the third dielectric layer, and the third width is less than the second width.

8. The semiconductor structure as claimed in claim 1, further comprising:
   a gate spacer layer alongside the gate stack of the transistor; and
   a mask layer on the top surface of the gate stack of the transistor, wherein the contact plug is in direct contact with the gate spacer layer and the mask layer.

9. The semiconductor structure as claimed in claim 1, wherein the transistor is a gate-all-around transistor.

10. The semiconductor structure as claimed in claim 1, further comprising:
    a silicide layer on a surface of the source/drain region of a transistor, wherein the contact plug is located the silicide layer.

11. A semiconductor structure, comprising:
    a source/drain feature abutting a channel layer;
    a gate stack surrounding the channel layer;
    a contact plug on the source/drain feature;
    a first dielectric layer over the contact plug;
    a second dielectric layer over the first dielectric layer and made of a different material than the first dielectric layer, and
    a via on the contact plug and through the first dielectric layer and the second dielectric layer and electrically connected to the source/drain feature, wherein the via includes a lower portion and an upper portion over the lower portion, the lower portion of the via has a first sidewall that is curved, and the upper portion of the via has a second sidewall that is linear, and the first sidewall is connected to the second sidewall at a first position, and the first position is higher than a bottom surface of the second dielectric layer, wherein the via has a minimum width measured at the first position.

12. The semiconductor structure as claimed in claim 11, wherein the lower portion of the via is partially embedded in the contact plug.

13. The semiconductor structure as claimed in claim 11, further comprising:
    a gate spacer layer on a sidewall of the gate stack; and
    a mask layer over a top surface of the gate stack and a top surface of the gate spacer layer, wherein the contact plug is interfaced with a sidewall of the gate spacer layer and a sidewall of the mask layer.

14. The semiconductor structure as claimed in claim 11, wherein an interface between the contact plug and the via is leveled with a bottom surface of the first dielectric layer.

15. A method for forming a semiconductor structure, comprising:
    forming a transistor over a substrate;
    forming a contact plug on a source/drain region of transistor;
    forming a first dielectric layer over the contact plug;
    forming a second dielectric layer over the first dielectric layer;
    etching the second dielectric layer to form an upper portion of an opening;

etching the first dielectric layer to form a lower portion of the opening, wherein the lower portion of the opening tapers upward; and forming a via in the opening.

16. The method for forming the semiconductor structure as claimed in claim 15, wherein the upper portion of the opening tapers downward.

17. The method for forming the semiconductor structure as claimed in claim 15, wherein etching the first dielectric layer to form the lower portion of the opening comprises using $H_2$.

18. The method for forming the semiconductor structure as claimed in claim 15, wherein forming the via in the opening comprises:

forming a barrier layer along sidewalls and a bottom surface of the via;

forming a metal bulk layer on the barrier layer to overfill the via; and removing the barrier layer and the metal bulk layer from a top surface of the second dielectric layer.

19. The method for forming the semiconductor structure as claimed in claim 15, further comprising:

forming a third dielectric layer over the transistor, wherein the contact plug is formed in the third dielectric layer, wherein the lower portion of the opening exposes the contact plug and the third dielectric layer.

20. The method for forming the semiconductor structure as claimed in claim 15, wherein etching the first dielectric layer to form the lower portion of the opening comprises:

laterally etching a first lateral etching amount at a top surface of the first dielectric layer; and laterally etching a second lateral etching amount at a middle height of the first dielectric layer, and the second lateral etching amount is greater than the first lateral etching amount.

* * * * *